United States Patent
Steiner et al.

(10) Patent No.: US 12,050,514 B1
(45) Date of Patent: Jul. 30, 2024

(54) DEEP NEURAL NETWORK IMPLEMENTATION FOR SOFT DECODING OF BCH CODE

(71) Applicant: Kioxia Corporation, Tokyo (JP)

(72) Inventors: Avi Steiner, Kiriat Motzkin (IL); Ofir Kanter, Haifa (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/184,872

(22) Filed: Mar. 16, 2023

(51) Int. Cl.
  *G06F 11/10* (2006.01)
  *H03M 13/15* (2006.01)
(52) U.S. Cl.
  CPC ....... *G06F 11/1068* (2013.01); *H03M 13/152* (2013.01)
(58) Field of Classification Search
  None
  See application file for complete search history.

(56) References Cited

U.S. PATENT DOCUMENTS

| | | | |
|---|---|---|---|
| 9,397,701 B1 * | 7/2016 | Micheloni | H03M 13/612 |
| 9,973,213 B2 * | 5/2018 | Hsiao | H03M 13/3723 |
| 10,963,338 B1 * | 3/2021 | Steiner | G11C 29/50004 |
| 11,082,069 B1 | 8/2021 | Steiner et al. | |
| 11,258,466 B1 | 2/2022 | Kanter et al. | |
| 11,563,450 B1 | 1/2023 | Kanter et al. | |
| 2012/0005560 A1 * | 1/2012 | Steiner | H03M 13/152 714/780 |
| 2019/0103885 A1 * | 4/2019 | Chang | H03M 13/3746 |
| 2020/0218607 A1 * | 7/2020 | Ha | G06F 11/1068 |
| 2022/0231700 A1 * | 7/2022 | Zhang | G06F 11/1076 |

OTHER PUBLICATIONS

H. Alhussien, J. Park and J. Moon, "Iterative Decoding Based on Error Pattern Correction," in IEEE Transactions on Magnetics, vol. 44, No. 1, pp. 181-186, Jan. 2008, doi: 10.1109/TMAG.2007.912943. (Year: 2008).*
Co-Pending U.S. Appl. No. 17/406,929, "System and Method for Dynamic Inter-Cell Interference Compensation in Non-Volatile Memory Storage Devices", Avi Steiner, et al., filed Aug. 19, 2021.

(Continued)

*Primary Examiner* — Daniel F. McMahon
(74) *Attorney, Agent, or Firm* — Foley & Lardner LLP

(57) ABSTRACT

Systems, methods, non-transitory computer-readable media to perform operations associated with the storage medium. One system includes a storage medium and an encoding/decoding (ED) system to perform operations associated with the storage medium, the ED system being configured to process a set of log-likelihood ratios (LLRs) and a syndrome vector to obtain a set of confidence values for each bit of a codeword, estimate an error vector based on selecting one or more bit locations with confidence values from the set of confidence values above threshold value and applying hard decision decoding to the selected one or more bit locations, calculate a sum LLR score for the estimated error vector, and output a decoded codeword based on the estimated error vector and the sum LLR score.

20 Claims, 11 Drawing Sheets

(56) References Cited

OTHER PUBLICATIONS

Co-Pending U.S. Appl. No. 17/407,096, "System and Method for Dynamic Compensation for Multiple Interference Sources in Non-Volatile Memory Storage Devices", Avi Steiner, et al., filed Aug. 19, 2021.
Co-Pending U.S. Appl. No. 17/574,929, "System and Method for Pre-Soft-Decoding Tracking Form NAND Flash Memories", Hanan Weingarten, filed Jan. 13, 2022.
Co-Pending U.S. Appl. No. 17/702,359, "Dynamic Interference Compensation for Soft Decoding in Non-Volatile Memory Storage Devices", Avi Steiner, et al., filed Mar. 23, 2022.

\* cited by examiner

DEEP NEURAL NETWORK IMPLEMENTATION FOR SOFT DECODING OF BCH CODE

TECHNICAL FIELD

The present disclosure relates generally to systems and methods for soft decoding for correcting errors in data storage devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP).

SUMMARY

Some arrangements relate to a memory system including a storage medium and an encoding/decoding (ED) system to perform operations associated with the storage medium, the ED system being configured to process a set of log-likelihood ratios (LLRs) and a syndrome vector to obtain a set of confidence values for each bit of a codeword, estimate an error vector based on selecting one or more bit locations with confidence values from the set of confidence values above threshold value and applying hard decision decoding to the selected one or more bit locations, calculate a sum LLR score for the estimated error vector, and output a decoded codeword based on the estimated error vector and the sum LLR score.

In some arrangements, the ED system is further configured to obtain, by soft sampling based on issuing multiple page-reads on a channel, the set of LLRs representing codeword bits of the codeword, wherein the channel is an additive noise channel and determine the syndrome vector for the codeword based on a parity check matrix and a hard decision vector of a channel output of the channel, wherein the ED system analyzes the set of LLRs based on the syndrome vector being above zero.

In some arrangements, the syndrome vector corresponds to a difference between an expected parity check value and an actual parity check value, and wherein each value per bit of the set of LLR values is a scaled version of the channel output of the channel, and wherein the decoded codeword includes a sum of reliabilities of all error locations.

In some arrangements, the syndrome vector is further determined based on the hard decision vector being multiplied by the parity check matrix, wherein the hard decision vector includes binary values for each bit of the codeword, and wherein the parity check matrix is an m by n (m×n) matrix where m is a number of check equations and n is a length of the codeword.

In some arrangements, the ED system is further configured to generate an updated syndrome vector, responsive to adding binary representations of the error vector to the syndrome vector and in response to the updated syndrome vector being non-zero, reject the outputted decoded codeword.

In some arrangements, the error vector corresponds to the one or more bit locations suspected to be erroneous when a confidence value of the set of confidence values at a bit location is above the threshold value, and wherein the sum LLR score is calculated based on executing a summation of a subset of LLRs of the one or more bit locations of the error vector suspected to be erroneous.

In some arrangements, processing includes using a trained model, wherein the trained model is a fully-connected (FC) deep neural network (DNN) including rectified linear unit (ReLU) activation nodes, and wherein the processing further includes executing a softmax function to obtain the set of confidence values for each bit of the codeword.

In some arrangements, the ED system is further configured to generate a plurality of candidate locations based on reliabilities of each bit of the codeword of a sorted set of LLRs of the set of the LLRs, wherein generating the plurality of candidate locations includes independently analyzing each LLR of the sorted set of LLRs, choose a first subset of candidate locations of the plurality of candidate locations within a first span of the sorted set of LLRs, wherein the chosen first subset of candidate locations corresponds to a plurality of first lowest LLRs of the sorted set of LLRs, and wherein each candidate location of the first subset of candidate locations is a bit-flip candidate, update the syndrome vector based on the chosen first subset of candidate locations, and wherein performing the operations associated with the storage medium includes soft BCH decoding and wherein the codeword is BCH component code.

In some arrangements, the syndrome vector is associated with a candidate counter, and wherein for each candidate location of the first subset of candidate locations of the syndrome vector a counter is incremented by one.

In some arrangements, the ED system is further configured to in response to the counter being below a maximum number of candidate solutions after the outputted codeword, choose a second subset of candidate locations of the plurality of candidate locations within a second span of the sorted set of LLRs, wherein the chosen first subset of candidate locations corresponds to a plurality of second lowest LLRs of the sorted set of LLRs and update the syndrome vector based on the chosen second subset of candidate locations, wherein for each candidate location of the second subset of candidate locations of the syndrome vector the counter is incremented by one.

In some arrangements, the decoded codeword is selected from a plurality of decoded codewords generated by a trained model based on selecting a minimum sum LLR score of a plurality of sum LLR score, and wherein the second subset of candidate locations includes at least one candidate location of the first subset of candidate locations.

In some arrangements, the ED system is further configured to identify, during a first iteration, a first bit location from the error vector with a first highest confidence value, update, during the first iteration, a first bit of a first LLR at the first bit location, update, during the first iteration, an output vector to include the first LLR, and update, during the first iteration, the sum LLR score based on a first LLR score of the first LLR.

In some arrangements, the ED system is further configured to update, during the first iteration, the syndrome vector corresponding to a bit-flip at the first bit location, in response to the syndrome vector being non-zero, analyze, during a second iteration, a second set of log-likelihood ratios (LLRs) and the updated syndrome vector to obtain a second set of confidence values for each bit of the codeword, identify, during the second iteration, a second bit location from the error vector with a second highest confidence value, update, during the second iteration, a second bit of a second LLR at the second bit location, update, during the second iteration, the output vector to include the second LLR, and update, during the second iteration, the sum LLR score based on a second LLR score of the second LLR.

Some arrangements relate to a memory system including a storage medium and an encoder/decoder (ED) system to performs operations associated with the storage medium, the ED system being configured to process, during a first iteration of a plurality of iterations, a set of log-likelihood ratios (LLRs) and a syndrome vector to obtain a set of confidence values for each bit of a codeword, estimate, during the first iteration, an error vector based on selecting one or more bit locations with confidence values above threshold value and applying hard decision decoding to the selected one or more bit locations, identify, during the first iteration, a first bit location from the error vector with a first highest confidence value, update, during the first iteration, the syndrome vector corresponding to a bit-flip at the first bit location, update, during the first iteration, a bit of a first LLR at the first bit location, update, during the first iteration, a sum LLR score based on a first LLR score of the first LLR, and output a decoded codeword based on the estimated error vector and the sum LLR score, responsive to completing the plurality of iterations.

In some arrangements, the ED system is further configured to obtain, by soft sampling based on issuing multiple page-reads on a channel, the set of LLRs representing codeword bits of the codeword, wherein the channel is an additive noise channel and determine the syndrome vector for the received codeword based on a parity check matrix and a hard decision vector of a channel output of the channel, wherein the ED system analyzes the set of LLRs based on the syndrome vector being above zero, wherein the syndrome vector is further determined based on the hard decision vector being multiplied by the parity check matrix.

In some arrangements, the syndrome vector corresponds to a difference between an expected parity check value and an actual parity check value, and wherein each value per bit of the set of LLR values is a scaled version of the channel output of the channel, and wherein the decoded codeword includes a sum of reliabilities of all error locations, and wherein the hard decision vector includes binary values for each bit of the codeword, and wherein the parity check matrix is an m by n (m×n) matrix where m is a number of check equations and n is a length of the codeword.

Some arrangements relate to a computer-implemented method including processing a set of log-likelihood ratios (LLRs) and a syndrome vector to obtain a set of confidence values for each bit of a codeword, estimating an error vector based on selecting one or more bit locations with confidence values from the set of confidence values above threshold value and applying hard decision decoding to the selected one or more bit locations, calculating a sum LLR score for the estimated error vector, and outputting a decoded codeword based on the estimated error vector and the sum LLR score.

In some arrangements, the computer-implemented method further includes obtaining, by soft sampling based on issuing multiple page-reads on a channel, the set of LLRs representing codeword bits of the codeword, wherein the channel is an additive noise channel, determining the syndrome vector for the received codeword based on a parity check matrix and a hard decision vector of a channel output of the channel, wherein the ED system analyzes the set of LLRs based on the syndrome vector being above zero, wherein the syndrome vector is further determined based on the hard decision vector being multiplied by the parity check matrix, generating an updated syndrome vector, responsive to adding binary representations of the error vector to the syndrome vector, and in response to the updated syndrome vector being non-zero, rejecting the outputted decoded codeword.

In some arrangements, the syndrome vector corresponds to a difference between an expected parity check value and an actual parity check value, and wherein each value per bit of the set of LLR values is a scaled version of the channel output of the channel, and wherein the decoded codeword includes a sum of reliabilities of all error locations, and wherein the hard decision vector includes binary values for each bit of the codeword, and wherein the parity check matrix is an m by n (m×n) matrix where m is a number of check equations and n is a length of the codeword.

In some arrangements, the computer-implemented method further includes generating a plurality of candidate locations based on reliabilities of each bit of the codeword of a sorted set of LLRs of the set of the LLRs, wherein generating the plurality of candidate locations includes independently analyzing each LLR of the sorted set of LLRs, choosing a first subset of candidate locations of the plurality of candidate locations within a first span of the sorted set of LLRs, wherein the chosen first subset of candidate locations corresponds to a plurality of first lowest LLRs of the sorted set of LLRs, and wherein each candidate location of the first subset of candidate locations is a bit-flip candidate, and updating the syndrome vector based on the chosen first subset of candidate locations, and wherein the syndrome vector is associated with a candidate counter, and wherein for each candidate location of the first subset of candidate locations of the syndrome vector a counter is incremented by one.

Figure 1:
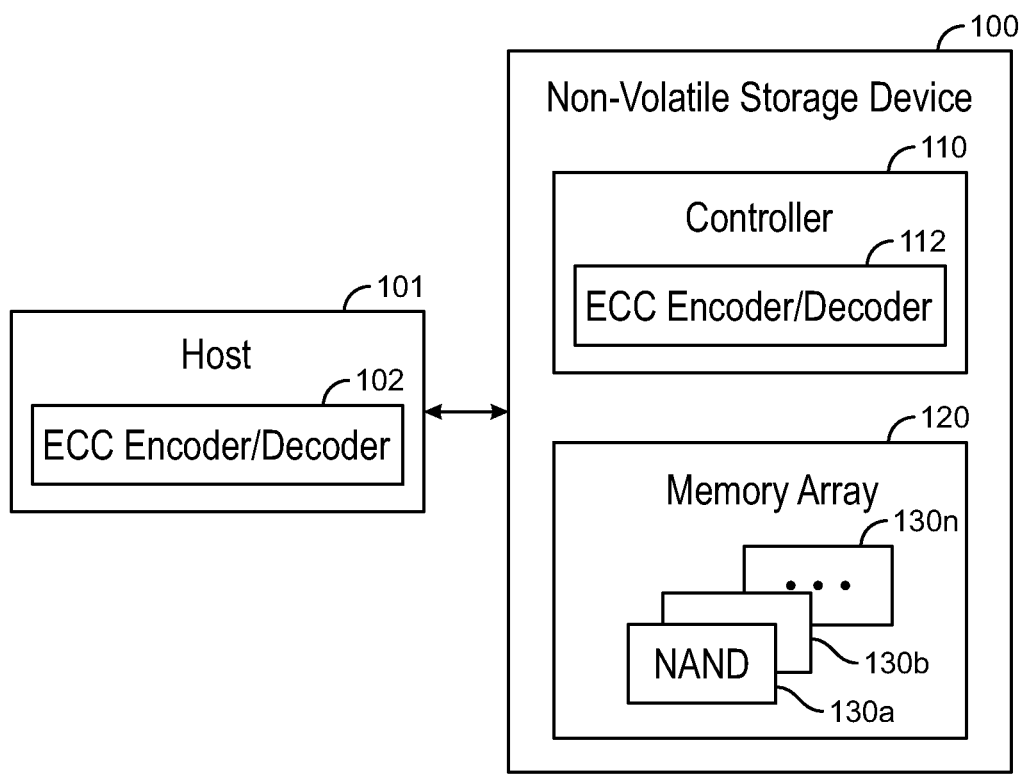
FIG. 1 shows a block diagram of examples of a system including a non-volatile storage device and a host, according to some arrangements.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

Referring generally to the figures, systems and methods for decoding using a neural network. In some embodiments, the DNN decoder can correct multiple errors, which reduces enumeration complexity and provides near-maximum-likelihood (ML) decoding capability. The DNN solver receives binary syndrome vectors and reliability inputs, and outputs a reliability per bit indicating the confidence level that a bit is an error. The DNN decoder can be implemented as a component decoder in larger decoders, such as a product code or a half folded product code. The systems and methods providers several embodiments for list decoding and iterative decoding with the DNN solver. For list decoding, a list of error location candidates is generated, and the DNN solver is used to obtain the complete error vector for each candidate. For iterative decoding, the DNN solver is used to select the most likely error suggested by the DNN and to update the syndrome, and then the DNN decoding is repeated until there are no further corrections or the output syndrome is zero. In some embodiments, the DNN used in all decoding systems and methods can be a fully connected DNN with optional batch normalization layers and normalized input. The number of neurons per layer and the total number of layers can be configured according to the code rate, and the network can be trained on noisy codeword examples using binary cross entropy loss as the loss function. In some embodiments, performing the operations associated with the storage medium includes soft BCH decoding where the codeword is BCH component code.

In particular, using a fully connected deep neural network (DNN) with Rectified Linear Unit (ReLU) activation nodes for decoding providers improvements over algebraic Bose-Chaudhuri-Hocquenghem (BCH) solvers because the system and methods provided herein reduce the complexity of enumeration required for achieving near maximum-likelihood (ML) decoding capability. In some embodiments, the DNN solver can correct multiple errors, and its architecture allows for approximation of ML performance while using low complexity neurons of type ReLU (or another type of neuron), and a simple fully connected multilayer perceptron (MLP) architecture. The proposed systems and methods also include list decoding and iterative decoding using a DNN solver, which further improve the capability of the decoding process. Additionally, the DNN solver can be trained on many examples of noisy codewords generated according to the channel analyze that the decoder needs to support, which allows for greater adaptability to different channel conditions.

That is, a DNN-based decoder reduces the enumeration complexity to achieve near maximum-likelihood (ML) decoding capability, as the DNN can correct multiple errors, whereas an algebraic BCH solver typically can only correct up to t errors. Additionally, the DNN architecture can approximate ML performance while using low complexity neurons of type Rectified Linear Units (ReLU), making it simpler and more efficient than traditional algebraic solvers. Moreover, DNN-based decoders can be more robust to channel noise and NAND programming errors, as they can be trained on examples of noisy codewords generated according to the channel analyze that the decoder needs to support. In some embodiments, DNN-based decoders can be adapted to new channel analyzes by retraining the network, whereas algebraic BCH solvers require code redesign and modification.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130*a*-130*n*. Each of the NAND flash memory devices 130*a*-130*n* includes one or more individual NAND flash dies, which are non-volatile memory (NVM) capable of retaining data without power. Thus, the NAND flash memory devices 130*a*-130*n* refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some implementations, the ECC encoders of the ECC encoder/decoder 102 are configured to encode data (e.g., input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short codewords. In some arrangements, the HFPC code structure is composed of multiple component codes. Each component code can be, for example, a BCH code. A number of components code n can be determined by the correction capability of each component code and code rate. For example, given a minimum distance D min per component code, the correction capability t of each component code can be represented by (Equation 1):

$$t=(D_{min}-1)/2$$

where the $D_{min}$, of a linear block code is defined as the smallest Hamming distance between any pair of code vectors in the code. The number of redundancy bits r can be represented by (Equation 2):

$$r=Q \cdot (D_{min}-1)/2$$

where Q is a Galois field parameter for the BCH component code defined over $GF(2^Q)$. Given a code rate R and payload length K bits, a number of component codes needed can be determined by (Equation 3 or Equation 4 respectively):

$$n = \left\lfloor K \cdot \frac{1-R}{r \cdot R} \right\rfloor$$

$$n = \left\lfloor 2K \cdot \frac{1-R}{Q \cdot (D_{min}-1) \cdot R} \right\rfloor$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
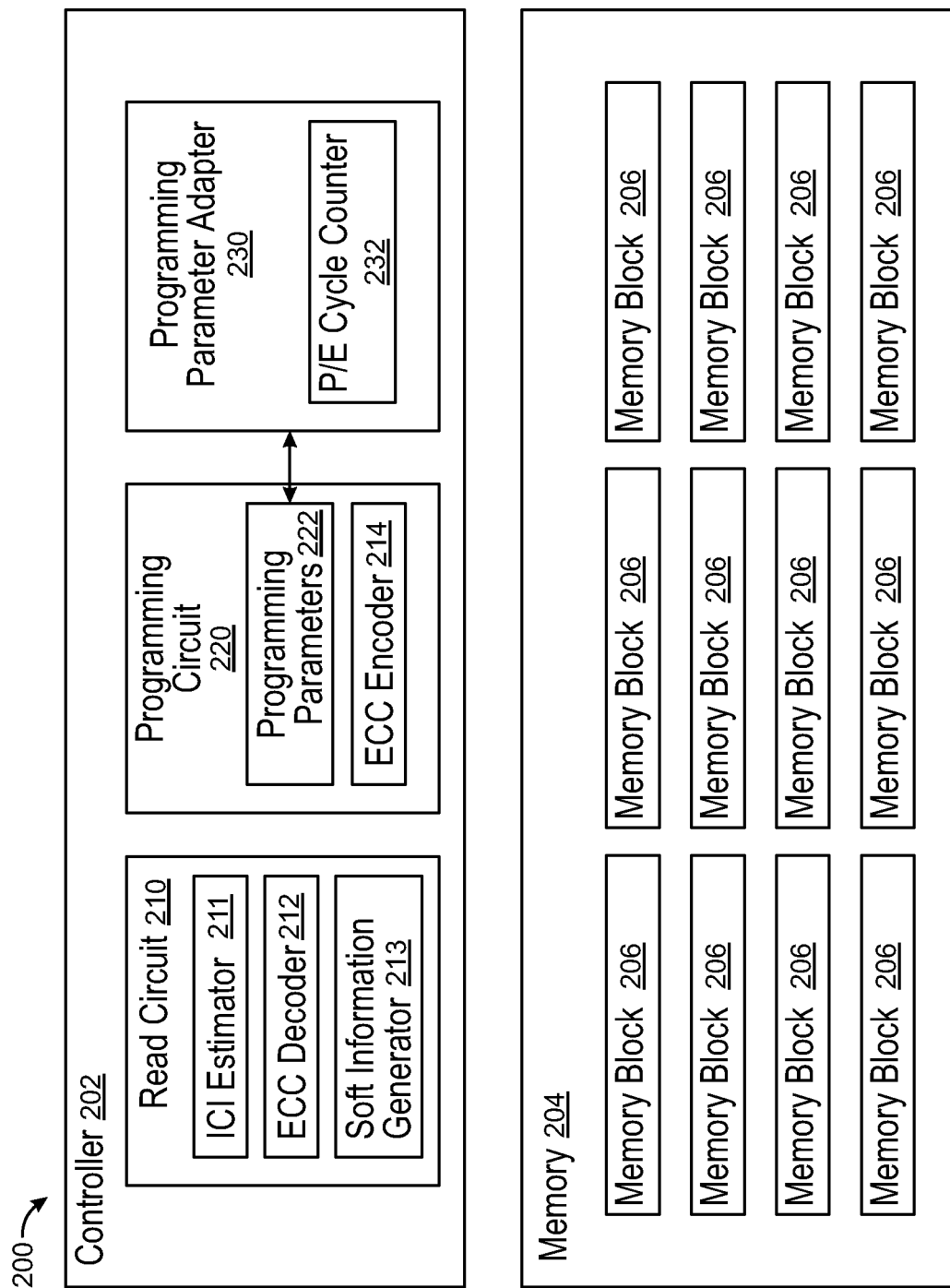
FIG. 2 is a block diagram illustrating a non-volatile storage device, according to some arrangements.

FIG. 2 is a block diagram illustrating a non-volatile storage device 200 according to some arrangements. In some arrangements, the non-volatile storage device may be a flash memory system which can perform any of the methods described in the present disclosure. Examples of the device 200 include but are not limited to, a SSD, a Non-Volatile Dual In-Line Memory Module (NVDIMM), UFS, a SD device, and so on.

In some arrangements, a different device (not shown) may communicate with the device 200 over a suitable wired or wireless communication link to execute some or all of the methods described herein. The device 200 may include a memory module or memory device 204 and a controller 202 for performing operations of the plurality of cells.

The controller 202 may include a read circuit 210, a programming circuit (e.g., a program DSP) 220 and a programming parameter adapter 230. In some arrangements, the read circuit 210 may include an ICI estimator 211, an ECC decoder 212 and/or a soft information generator 213. In some arrangements, the programming circuit 220 may include an ECC encoder 224 and programming parameters 222. In some arrangements, the programming parameter adapter 230 may include a program/erase cycle counter 232. Examples of the controller 202 include but are not limited to, an SSD controller (e.g., a client SSD controller, a datacenter SSD controller, an enterprise SSD controller, and so on), a UFS controller, or an SD controller, and the like. Arrangements of controller 202 can include additional or fewer components such as those shown in FIG. 2.

The controller 202 can combine raw data storage in the plurality of memory blocks 206 such that the memory blocks 206 function as a single storage. The controller 202 can include microcontrollers, buffers, error correction systems, flash translation layer (FTL) and flash interface modules. Such functions can be implemented in hardware, software, and firmware or any combination thereof. In some arrangements, the software/firmware of the controller 210 can be stored in the memory 204 or in any other suitable computer readable storage medium.

The controller 202 includes suitable processing and memory capabilities for executing functions described herein, among other functions. As described, the controller 202 manages various features for the memory block 206 in the memory 204 including, but not limited to, I/O handling, reading, writing/programming, erasing, monitoring, logging, error handling, garbage collection, wear leveling, logical to physical address mapping, data protection (encryption/decryption), and the like.

In some arrangements, the ICI estimator 211 of the read circuit 210 may be configured to estimate an interference state based on a result of a read operation on a first neighboring cell of a first cell (e.g., a target cell) among the plurality of cells. In some arrangements, a statistical dependency modeling of main interference sources and their impact can be characterized. For example, the ICI estimator 211 may be configured to perform a statistical dependency modeling of interference sources and their impact.

In some arrangements, the statistical dependency modeling of main interference sources and their impact can be characterized offline. For example, statistical dependency modeling may be performed offline when different programming schemes of different non-volatile memory storage devices increases the difficulty of performing statistical dependency modeling online. For example, the programming scheme of one generation of non-volatile memory storage devices may be different from that of another generation of non-volatile memory storage devices.

In some arrangements, the ICI estimator 211 may perform a statistical dependency modeling of interference sources and their impact offline. In some arrangements, to perform such statistical dependency modeling offline for a target non-volatile memory storage device (e.g., the memory 204), the ICI estimator 211 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), at least information on the programming scheme of the target non-volatile memory storage device so that it can accurately model the interference sources and their impact in the target non-volatile memory storage device.

In estimating the interference state, the ICI estimator 211 may be further configured to estimate a level at which the first neighboring cell is programmed. For example, the ICI estimator 211 may estimate, based on a result of a read operation on the first neighboring cell, a level at which the first neighboring cell is programmed. The ICI estimator 211 may then estimate an interference state of the first neighboring cell based on the estimated programmed level of the first neighboring cell. In some arrangements, the interference state of a neighboring cell is an estimated programmed level of the neighboring cell.

In estimating the interference state, the ICI estimator 211 may be further configured to obtain the result of the read operation on the first neighboring cell from pre-fetch of a next page read or by saving a previous read result. For example, in estimating the interference state for a target cell in a target page, the ICI estimator 211 may obtain a read result of a neighboring cell (of the target cell) in a next page that is to be read next to the target page, by pre-fetching the read result of the next page. In some arrangements, the ICI estimator 211 may obtain a read result of a neighboring cell (of the target cell) in a previous page that has been read prior to the target page, by saving and reusing the read result of the previous page. In this manner, in some arrangements, the ICI estimator 211 may be configured to estimate interference states for decoding results of read operations on the plurality of cells by reading the rows of the plurality of cells sequentially and only once. In some arrangements, the ICI estimator 211 may estimate the inference state of a neighboring cell from a distribution of state (or level) programmed in the neighboring cell.

In some arrangements, the ICI estimator 211 may analyze and model the interference state for a target cell as a function of one or more cells adjacent to the target cell. In some arrangements, to analyze the contribution of interference of each neighboring cell, a single neighboring row state estimation may be performed. For example, the ICI estimator 211 can estimate the interference state of a neighboring row from a hard read before decoding. In some arrangements, the ICI estimator 211 can estimate the interference state of a neighboring row post decoding as true data.

In some arrangements, once interference sources and their impact are modeled or identified, simple signal processing operations can be performed to compensate for or decouple the interference. For example, sampling results of a target page can be post-processed to compensate for or decouple the interference. In some arrangements, reliability information for reading or decoding of a target page can be provided. For example, the soft information generator 213 of the read circuit 210 may be configured to generate reliability information (e.g., calculating a probability of error) and provide soft information based on the reliability information. In some arrangements, the soft information generator 213 of the read circuit 210 may be configured to generate soft information based on the estimated interference state and a read value from the first cell.

The ECC decoder 212 may be configured to decode soft information as a result of read operations on cells. Additionally, or alternatively, the ECC decoder 212 may correct errors, improving accuracy and stress relief of a non-volatile memory storage controller. The controller 202 may also include a programming circuit 220. The programming circuit may include an ECC encoder 224 and programming parameters 222. For example, the ECC encoder 224 may determine the soft labels from the soft samples. The controller 202 may also include programming parameter adapter 230. The adapter 230 may adapt the programming parameters 222 in the programming circuit 220. The adapter 230 in this example may include a Program/Erase (P/E) cycle counter 232. Although shown separately for ease of illustration, some or all of the adapter 230 may be incorporated in the programming circuit 220.

The memory 204 may be an array of memory blocks 206. The memory blocks may include non-volatile memory such as NAND flash memory, dynamic random access memory (DRAM), magnetic random access memory (MRAM), phase change memory (PCM), ferro-electric RAM (Fe-RAM), and so on. In some arrangements, the memory 204 may have a plurality of cells. In some arrangements, each of the memory blocks 206 may have a plurality of cells. In some arrangements, the cell memory (e.g., the memory 204 or a memory block 206) may include rows and columns of the plurality of cells. In some arrangements, a memory block 206 may include a plurality of pages (not shown) and a page may be defined as cells linked with the same wordline, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell. Additionally, or alternatively, the memory 204 can comprise or be implemented using a plurality of dies, each of the dies containing a plurality of the blocks 206.

Figure 3:
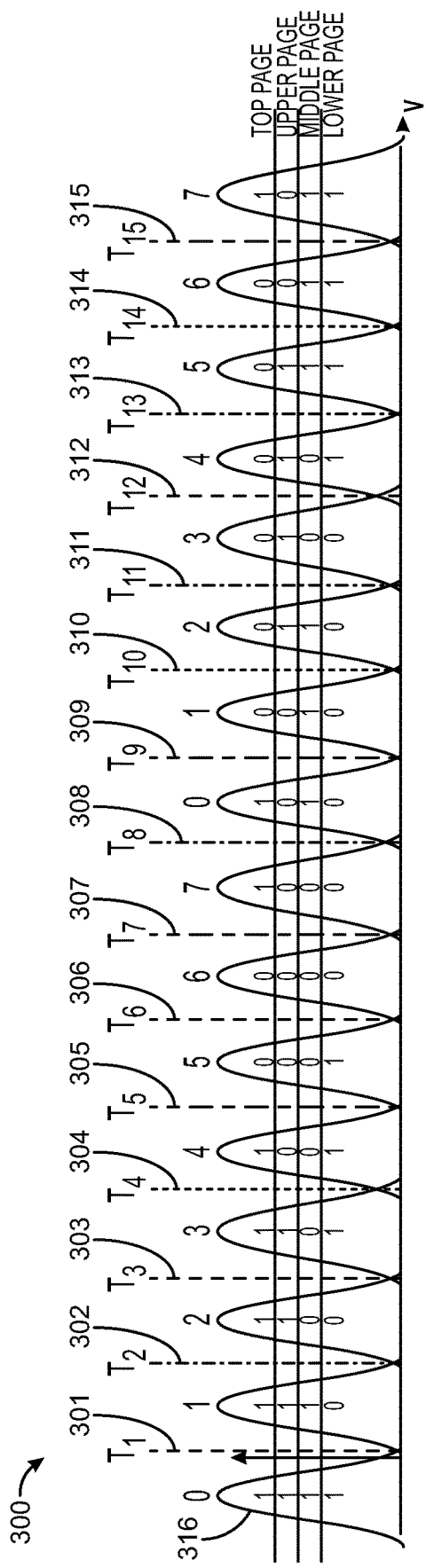
FIG. 3 is a diagram of histograms with VT distributions of a four bits per cell (bpc) non-volatile memory storage device, according to some arrangements.

FIG. 3 is a diagram of histograms 300 with VT distributions of a four bits per cell (bpc) non-volatile memory storage device (e.g., a flash memory device such as a QLC with 16 programmable states), according to some arrangements. Depicted are 16 lobes (distributions, or histograms) corresponding to the 16 different bit combinations of four bits represented by the charge state of the cell. A lower page read requires using thresholds T1 301, T3 303, T6 306 and T12 312 to separate the histograms into those with LSBs of 0 into those of LSBs of 1. Read thresholds T2 302, T8 308, T11 311, and T13 313 are used to separate the histograms into those with LSBs of 0 and those with LSBs of 1 for reading middle pages, read thresholds T4 304, T10 310, and T14 314 are used to separate the histograms into those with LSBs of 0 and those with LSBs of 1 for reading upper pages, and read thresholds T5 305, T7 307, T9 309 and T15 315 are used to separate the histograms into those with LSBs of 0 and those with LSBs of 1 for reading top pages. The lower histogram 300 may be considered the erase level.

As described herein, when read operations are performed on a target row, interference may be induced. In some implementations, a fixed ICI compensation may be added to read thresholds. However, the fixed compensation may not be effective in improving BER because depending on the ICI state, stress condition of the device, and the read threshold, the degree of the added ICI compensation varies. For example, while the effect of an induced ICI state may be known (e.g., shifting the threshold higher or lower than the ideal/optimum ICI compensation threshold associated with no ICI state threshold), the degree of the shift in the direction may be unknown.

Figure 4:
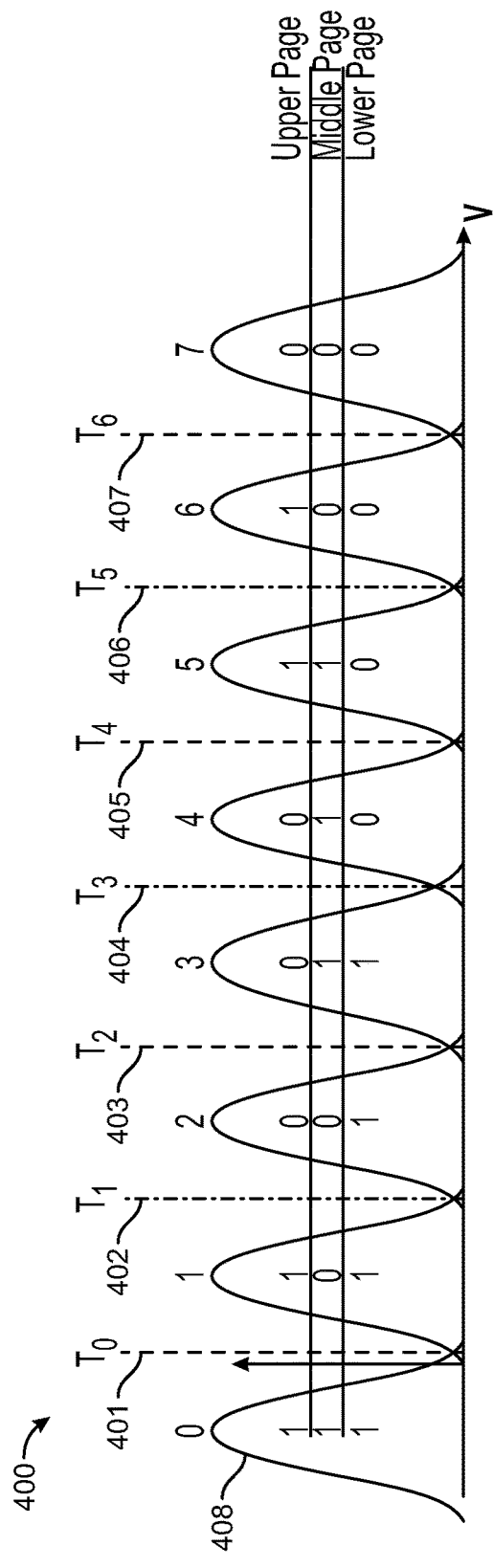
FIG. 4 is a diagram of a superposition of eight possible VT distributions of a three bits per cell flash memory device without any ICI information, according to some arrangements.

Now, arrangements of estimating an interference state will be described with reference to FIG. 4. FIG. 4 is a diagram of a superposition of the eight possible VT distributions 400 of a three bits per cell (bpc) memory device without any ICI information, according to some arrangements. Depicted are eight lobes (distributions, or histograms) corresponding to the eight different bit combinations of three bits represented by the charge state of the cell. A lower page read requires using thresholds $T_3$ 403 to separate the histograms into those with LSBs of 0 and those with LSBs of 1. Read thresholds To 400, $T_2$ 402 and $T_5$ 405 are used to separate the histograms into those with LSBs of 0 and those with LSBs of 1 for reading middle pages, and read thresholds $T_1$ 401 $T_4$ 404 and T6 406 are used to separate the histograms into those with LSBs of 0 and those with LSBs of 1 for reading upper pages. The lower histogram 407 may be considered the erase level.

FIG. 4 shows a voltage threshold distribution of a 3 bits per cell (bpc) flash memory device. The voltage threshold (VT) distribution includes eight lobes. An MSB (most significant bit) page read requires using thresholds T0, T4. For reading CSB (center significant bit) pages the read thresholds T1, T3 and T5 are used. For reading LSB (least significant bit) pages the read thresholds T2 and T6 have to be used. The lower most distribution is known as the erase level.

Due to different NAND noise and interference sources during programming and during read, there may be errors in the programmed and read output. This can be due to programming errors, or during read with non-optimal thresholds or following retention/read-disturb stresses, etc. The result of all these noise sources is errors on the information bits that are originally saved to NAND. A strong error correction code (ECC) can allow faster programming, with possibly higher programming errors, and read under high stress conditions, and/or with lower complexity digital signal processing (DSP).

A code rate is defined by the ratio of its information content, called payload, to the overall size of a codeword. For example, for a code that contains k bits and r redundancy bits that rate is defined by $R_c=k/(k+r)$. The common encoding methods are not very well suited to support high rate codes when both hard and soft decoding are considered. For example, for conventional low-density parity-check codes (LDPC) for very high rates (say 0.9), the code length tends to be considerable resulting in a very complex and costly implementation.

In some implementations, a special structure of multi-dimensional encoding with simple code components can obtain high decoding efficiency with a reasonable complexity for both hard input or soft input to the decoder. These properties make a code especially suitable for storage applications such as NAND Flash devices or controllers for NAND flash. Some key features of this coding scheme are instrumental in designing a coding system for storage. One of the features is high raw bit error rate (RBER) error correction capability with hard input to the decoder, which is important in a storage system since it requires a single read operation. This means that high performance on read from the storage device may be achieved throughout the device lifespan. Another key feature is configurability. For example, the code rate may be configured per application, and with a single engine it is possible to configure with firmware the code parameters which determine the payload size and redundancy size. This feature allows using different codes for different type of pages, according to their RBER characteristics. Alternatively, payload size can be determined such that the tradeoff of performance vs reliability is optimized. Another key feature is high raw bit error rate (RBER) error correction capability with soft input to the decoder. This feature is important in storage systems since it can provide high reliability at high Program/Erase (P/E) cycle counts and difficult retention conditions. This feature is crucial for storage systems which typically require a very small undecodable bit error rate (UBER) of 1E-15.

In multi-dimensional encoding, a stream of data is passed through a set of multiple component encoders, which together encode the full payload into a single codeword. For example, Bose-Chaudhuri-Hocquenghem (BCH) encoding may be done by using a shift register through which the systematic data is passed. Therefore, that data simply passes through the component encoders without being modified while the shift-register advances. When the systematic data of the code completely passed through the shift-register, the content of the shift register is the redundancy of the code and is appended to the data stream. This principle works for all component encoders in all dimensions.

Multi-dimensional encoding also can be obtained with product codes or symmetric product codes, which is a special case of product codes, and may provide improved capabilities. These structures create a product of code components to obtain a full codeword, and the decoding process typically involves iterative decoding of the component codes. In some arrangements, the ECC structure includes a modified half product code, referred to as a half folded-product code (HFPC). A HFPC structure is composed of multiple small code components, where each code component can be for example a BCH code. The number of code components n is determined by the correction capability of each component and the required code rate.

Figure 5:
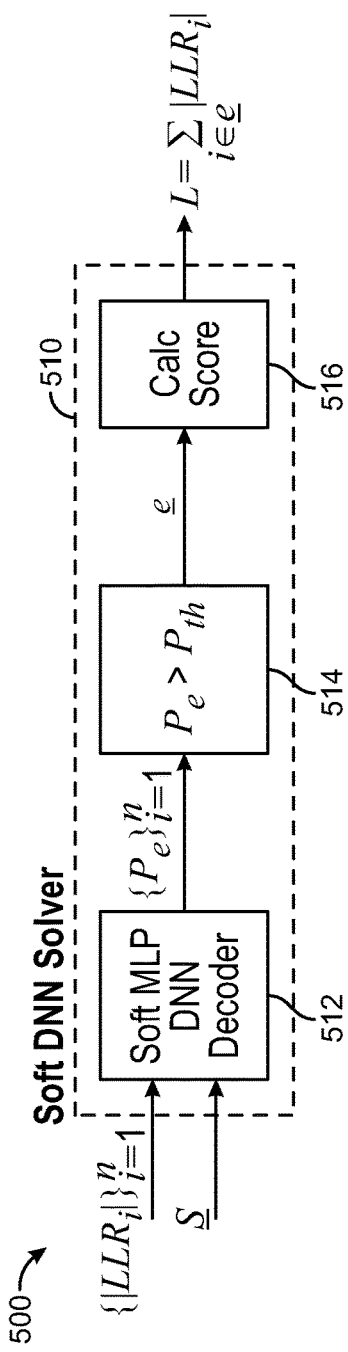
FIG. 5 is a soft neural network solver to perform operations associated with a storage medium, according to some arrangements.
Figure 6:
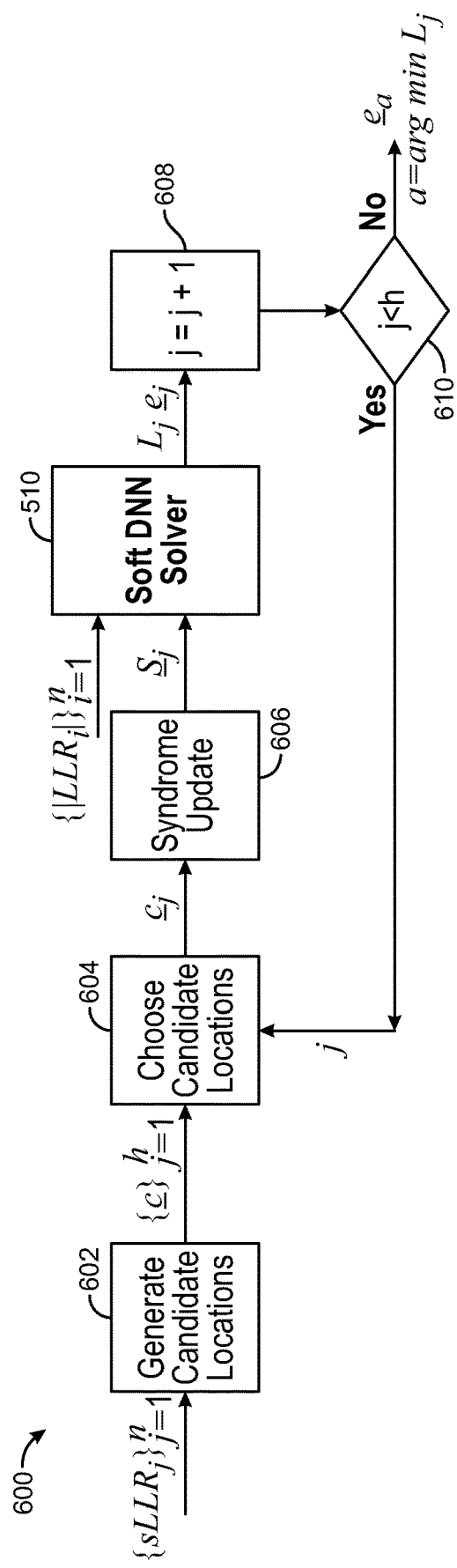
FIG. 6 is the soft neural network solver of FIG. 5 of a BCD code, according to some arrangements.

Referring to FIGS. 5-6 generally, the systems and methods disclose a neural network (e.g., fully connected (FC) deep neural network (DNN)) with rectified linear unit (ReLU) activation nodes for decoding. It should be understood other neural networking techniques can be used to implement the system and methods described herein (e.g., artificial neural networks (ANN), convolution neural networks (CNN), recurrent neural networks (RNN), feedforward neural network (FNN), modular neural network (MNN), deep belief network, Hopfield network, radial basis function network, autoencoder, generative adversarial network, etc.). In some embodiments, the systems and methods described herein provide a maximum-likelihood (ML) decoding capability, significantly reducing the enumeration complexity as the DNN solver can correct multiple errors greater than the number of correctable errors of an algebraic BCH decoder. Moreover, the DNN architecture allows approximation of ML performance while using low complexity neurons of type ReLU, and a FC MLP architecture.

In the context of the DNN solver described below, some definitions are used. These include k and n, which refer to the number of payload bits and total codeword bits, respectively. The input to the solver is denoted as $\{LLR_i\}_{i=1}^n$, and the sorted input in ascending $|LLR_i|$ order as $\{sLLR_j\}_{j=1}^n$. The syndrome vector computed on the input is represented as S, and the soft DNN decoder output per bit error probability (DNN confidence output) is denoted by $\{P_e\}_{i=1}^n$. The estimated error vector is denoted by e, and the sum LLR score for a suggested solution of the soft DNN decoder is represented as $S_{LLR} \triangleq L = \Sigma_{i \in e} |LLR_i|$.

In some embodiments, the LLR values per bit can be the scaled/rounded version of the channel output. For example, the channel can be an additive Gaussian noise (AWGN) channel, as given in (Equation 5):

$$y_i = x_i + w_i, \ i=1, \ldots, n$$

where $x_i$ represents the codeword bits represented by +/−1, and $w_i$ is the added noise by the channel.

In an AWGN channel, $w_i \sim N(0, \sigma^2)$ and identically independently distributed (iid) for all n codeword bits. The LLRs per bit are given by (Equation 6):

$$LLR_i = \lceil c \cdot y_i - a \rceil$$

where a and c are fixed scalar coefficients for scaling and offset, and a round-up operation creates the integer-valued LLR. It should be understood that a same solution can be used for any other channel model, such as an AWGN channel with additional high LLR errors, which may result from NAND programming errors or heavy noise tail.

Referring now to FIG. 5, a soft neural network solver 500 to perform operations associated with a storage medium, according to some arrangements. At block 512, the Soft DNN solver can model a binary representation of the syndrome vector, S, and reliability inputs of the component codeword, $\{|LLR_i|\}_{i=1}^n$. In some embodiments, DNN solver's output is a reliability per bit, which is obtained using a soft-max operator on the last layer of the DNN. The vector $\{P_e\}_{i=1}^n$, the DNN solver's output, represents the DNN's confidence level for each bit. When $P_e(i)$ is close to 1, the DNN is confident that the i-th bit is erroneous, and when $P_e(i)$ is close to 0, the DNN is confident that the bit is correct.

In some embodiments, the syndrome vector is computed based on the parity check matrix H and the hard decision vector Specifically, the hard decision of the channel output, denoted by the vector is computed using the rule (Equation 7):

$$b_i = \begin{cases} 1, & y_i > 0 \\ 0, & \text{else} \end{cases} = \begin{cases} 1, & LLR_i > 0 \\ 0, & \text{else} \end{cases}$$

where $y_i$ is the channel output and $LLR_i$ is the log-likelihood ratio for the i-th bit. The syndrome vector is then computed by multiplying the hard decision vector $b_i$ with the parity check matrix H (Equation 8):

$$S = H \cdot b$$

where b is the hard decision input vector and the resulting syndrome vector is S. In other words, the syndrome vector is the product of the parity check matrix with the hard decision vector. The syndrome vector represents the difference between the expected and the actual parity check values, and is used to detect errors in the codeword.

In the context of the list decoding with a DNN solver, the candidate counter refers to the variable that keeps track of the current hypothesis or candidate being evaluated. The candidate counter is initialized to 1, and for each hypothesis, the syndrome vector is updated, the DNN solver is used to obtain the complete error vector, and the sum of reliabilities of the error hypothesis candidate and all DNN solver error locations is calculated.

A candidate refers to a potential error location hypothesis or a bit-flip candidate that is considered in the list decoding process. In the embodiment where only single bit-flip candidates are considered, the list of candidates includes only one candidate for each hypothesis. In other words, only a single bit-flip per hypothesis is considered. On the other hand, in the embodiment where multiple bit-flips are considered, the list of candidates includes hypotheses of multiple bit-flips. In this case, the list size h may need to be larger compared to the single bit-flip embodiment.

The sorted reliabilities of each codeword bit $\{sLLR_j\}_{j=1}^n$ can be used to generate the list of candidates. Specifically, the number of candidates may be limited to h, and the list is generated by choosing locations with relatively low reliability, e.g., low $|LLR_j|$. In some embodiments, the list of candidates may include bit flips of one up to three or four bits, all within a predetermined span of the sorted locations of $\{sLLR_j\}_{j=1}^n$.

In some embodiments, once a candidate is evaluated, the candidate counter j is incremented (block 608), and the process is repeated for the next solution candidate until all candidates have been evaluated. If a candidate solution does not result in a zero (0) syndrome, then that candidate solution is rejected, and the process continues with the next candidate. The list decoding with a DNN solver embodiment may lead to increased decoding accuracy (e.g., when dealing with noisy channel conditions), as it is able to generate a list of possible error candidates and use the DNN solver to determine the most likely error locations.

In some embodiments, the syndrome is computed based on the parity check matrix H and the hard decision input vector b. The syndrome is updated for each candidate error location $e_j$, which is a vector indicating the locations of bit flips. If the updated syndrome $S_j$ using a candidate error location $e_j$ is not zero, it indicates that the candidate error location is not a valid error for the code. In other words, the updated syndrome represents a discrepancy between the parity check matrix and the candidate error location. In some embodiments, the syndrome can be zero if the candidate error location is a valid error for the code, meaning that the candidate error location satisfies the parity check matrix H. In this case, the DNN solver can be used to obtain the complete error vector. If the syndrome is not zero, then the optional step of applying a BCH hard-decoding operation may be used to further refine the candidate error location.

In some embodiments, an optional step in the decoding process can occur where if the syndrome update using the error locations does not result in a syndrome of zero (0), a BCH hard-decoding operation is applied on the hard decision with flipped states of the error vector e. The fixes by the hard decoder are then appended to the e vector, which becomes the new output of the soft BCH decoder. In some embodiments, this step of hard-decoding may be applied if a DNN solver is available, and may improve the overall decoding capability. In particular, this provides an additional layer of error correction, which can further improve the overall performance of the decoding process (e.g., when dealing with channels with high noise or other distortions). Thus, the ability to combine hard-decoding with DNN-based decoding offers flexibility in designing error correction systems that can be tailored to specific needs and requirements, such as power consumption or processing speed.

At block 514, the DNN outputs the locations for which $P_e(i)$ is greater than a preconfigured scalar value $P_{th}$, which is between 0.5 and 1. In some embodiments, the range may be different, e.g., 0.4 and 1, 0.35 and 0.95, etc. If $P_{th}$=0.5, all the suspected error locations can be determined for a single activation of the DNN solver. That is, the error vectors are combined to generate a set of possible solutions. Each solution in the set corresponds to a combination of error locations from the list of candidates, and its likelihood is determined by calculating the sum of the LLR values of the error locations in the solution (block 516).

At block 516, the calculated score relates to the process of soft decoding the received codeword by iteratively applying a DNN solver to the input reliability values and using the output to update the syndrome vector until convergence. The soft output of the DNN solver is the sum of reliabilities of all the error locations, which is denoted by $S_{LLR}$ ≜ L=$\Sigma_{i \in e}|LLR_i|$, where e is the locations vector of bits for which $P_e(i)$ is greater than $P_{th}$. In some embodiments, performing the operations associated with the storage medium includes soft BCH decoding where the codeword is BCH component code.

That is, once a list of error location candidates is generated and the corresponding error vectors are obtained using the DNN solver (block 512), the error vectors are combined to generate (block 514) a set of possible solutions. Each solution in the set corresponds to a combination of error locations from the list of candidates, and its likelihood is determined by calculating the sum of the LLR values of the error locations in the solution (block 516). The sum LLR score for each solution is compared, and the solution with the minimum sum LLR score is selected as the most likely error pattern for the received codeword. This solution is used to correct the errors in the codeword, resulting in an error-free decoded codeword. The iterative nature of the process and the use of DNN solver improve the decoding performance and reduce the enumeration complexity required for achieving near maximum-likelihood decoding capability.

Referring now to FIG. 6, the soft neural network solver of FIG. 5 of a BCD code, according to some arrangements. In some embodiments, a vector is used to determine if an error has occurred in a received codeword in a communication system that uses ECCs. It is computed by multiplying the received codeword by the parity check matrix of the code. If the result is a zero vector, the received codeword is assumed to be free of errors; otherwise, it contains one or more errors. In this embodiment, the syndrome vector is determined based on a parity check matrix and a hard decision vector of a channel output of the channel. A hard decision vector is a vector that indicates the binary value of each bit of the received codeword, which is obtained by making a threshold comparison on the channel output. The parity check matrix, on the other hand, is a matrix that describes the relationship between the codeword and its parity checks.

In some embodiments, a parity check matrix is a mathematical representation of a linear block code that describes the linear dependencies between the code's codewords. For example, it can be an m×n matrix, where m is the number of check equations (or constraints) and n is the length of the codewords. The parity check matrix provides a set of constraints that the codewords must satisfy in order to be valid. These constraints are derived from the code's generator matrix, which is a matrix that maps a message vector to a codeword. The generator matrix can be chosen such that the resulting codewords satisfy a set of desired properties, such as error-correcting capability and minimum distance. In some embodiments, the parity check matrix is constructed such that each row corresponds to a check equation, which is a linear combination of the code's codeword bits. The elements of the matrix can be either 0 or 1, and the matrix is designed such that the product of the parity check matrix and the transpose of the codeword vector is zero, e.g., it satisfies the equation H×$c^T$=0, where H is the parity check matrix, $c^T$ is the transpose of the codeword vector, and 0 is a vector of zeros. Accordingly, the parity check matrix can be used to determine a syndrome vector for the received codeword based on a hard decision vector of a channel output of the channel. The syndrome vector is then updated based on the error candidates generated by analyzing the sorted set of LLRs.

To generate a plurality of candidate locations (block 602) for error correction, the reliabilities of each bit of the codeword are first sorted into a set of Log-Likelihood Ratios (LLRs), which indicate the confidence of the received bits. A sorted set of LLRs is obtained, and then analyzed (e.g., independently) each LLR in the order of the sorted set of LLRs to generate the candidate locations. The process then chooses (block 604) at least one candidate location of the plurality of candidate locations within a span of the sorted set of LLRs, which is the lowest LLR of the sorted set of LLRs. This candidate location is a bit-flip candidate, meaning that it is a location in the codeword where a bit flip is assumed to have occurred, and it is chosen based on its low confidence level as reflected in the LLR. Finally, the syndrome vector is updated (block 606) based on the chosen at least one candidate location. This is done by applying the parity check matrix to the codeword with the candidate location flipped, which results in an updated syndrome vector. The updated syndrome vector is used to determine if the error correction process should continue, or if the received codeword is free of errors.

In this embodiment, the DNN solver is used to generate a list of error hypotheses and the candidate counter j is incremented for each candidate (block 608). For a specific candidate j, the channel input syndrome S is updated (block 606) based on the chosen candidate location (block 604), resulting in a new updated syndrome $S_j$. The updated syndrome is then used in combination with the original channel outputs of the n values of $\{|LLR_i|\}_{i=1}^n$. As shown, the DNN solver output is an error vector which corresponds to all locations for which $P_e(i) > P_{th}$, where $P_e$ is a probability estimate output by the DNN solver and $P_{th}$ is a preconfigured scalar value that ranges between 0.5 and 1 (e.g., $0.5 < P_{th} < 1$). All of the locations that are suspected to be erroneous bits based on the DNN solver output are included in the error hypothesis candidate $e_j$. As shown. each candidate solution j has a corresponding set of error locations $e_j$, and the sum LLR score for this candidate solution is denoted as $L_j$. The variable j is incremented (block 608) to move on to the next candidate solution in the list of candidates, and to evaluate the sum LLR score for that solution. The iterative process continues until all candidate solutions have been evaluated.

In some embodiments, the soft output of can be the sum of reliabilities of the error hypothesis candidate and all DNN solver error locations, e.g., $S_{LLR} \triangleq L_j = \Sigma_{i \in e_j} |LLR_i|$. In case the updated syndrome using the error location candidate does not result in a zero (0) syndrome, the candidate solution is rejected (block 610). The candidate counter j is then incremented (block 608), and the process is repeated (e.g., repeat blocks 604, 606, and 510) for the next solution candidate. The sum-LLR is a measure of the accumulated reliability of the estimated error vector in a decoding process. It is calculated as the sum of the absolute values of the LLRs for all the bit positions where errors are estimated to occur. In other words, it is a measure of the overall confidence in the estimated error positions. The sum-LLR is used to select the most likely error vector when multiple candidates are generated in the decoding process, and the candidate with the minimum sum-LLR is selected as the final output. When a DNN solver is used to decode a received codeword (block 512), it outputs a set of LLRs, one for each bit in the codeword. These LLRs represent the confidence of the decoder that the corresponding bit is either a "0" or a "1". In the decoding process, the DNN solver identifies a set of error positions in the received codeword where the probability of error is higher than a pre-determined threshold. These error positions are indicated by the output LLRs greater than a certain value, which is defined by the threshold (block 514). The sum LLR score is calculated for a suggested solution of the soft DNN decoder, which is a set of error positions with the highest probability of error. The sum LLR score is calculated by adding up the absolute values of the LLRs of all the error positions in the suggested solution (block 516). The larger the sum LLR score, the higher the confidence that the suggested solution is correct.

As should be understood, variable j represents the candidate solution being currently evaluated by the iterative decoding process. The variable h represents the maximum number of candidate solutions that can be generated in the process. The iterative process described in FIGS. 5 and 6 continue until the candidate counter j reaches the value of h, meaning that all possible candidate solutions have been generated and evaluated. At this point, if no valid solution has been found, the iterative process stops, and the decoding fails.

With reference to the candidate solution, it refers to a potential error correction that is being considered for a specific codeword based on the candidate locations generated by the DNN solver. When a candidate location is chosen, the syndrome vector is updated accordingly. The updated syndrome vector is used, along with the original channel outputs, to obtain the complete error vector using the DNN solver. If the combination of the candidate location and the DNN solver error locations does not result in a syndrome vector of 0, then this candidate solution is rejected. A syndrome vector equal to 0 indicates that the error locations have been correctly identified and corrected, resulting in a codeword that is error-free. However, if the combination of the candidate location and the DNN solver error locations does not result in a 0 syndrome, it means that the DNN solver has failed to correctly identify and correct all errors in the codeword. Therefore, the candidate solution is rejected, and the next candidate solution is considered. In some embodiments, this process is repeated for each candidate solution until an error-free codeword is obtained, or until all candidate solutions have been evaluated without achieving a 0 syndrome.

With reference to a=arg min $L_j$, a codeword candidate that is selected from the list of error candidates generated in the list decoding process (block 510). The list decoder generates a list of candidates by selecting locations with low reliability values and then generating error location candidates. Each of these candidates has an associated likelihood that is calculated by summing the corresponding LLR values. Once the list of error candidates is generated, a decoder selects the candidate that corresponds to the highest likelihood solution. This selection is based on taking the minimum sum of the LLR values associated with each error location candidate. This approach ensures that the selected candidate has the highest likelihood of being the true error vector. After the candidate with the highest likelihood is selected, it is used to update the received codeword based on the error locations in the candidate. This updated codeword is then used to generate a new syndrome vector. If the new syndrome vector is zero, the decoding process is completed, and the candidate is considered to be the decoded message. If the syndrome vector is not zero, the process is repeated with the next highest likelihood candidate until the syndrome vector is zero or all candidates have been evaluated.

In some embodiments, a single error location candidate may be chosen, which means that only one bit-flip per hypothesis is considered. This approach can be beneficial in cases where the DNN solver has high capability and can correct almost all codeword errors. In some embodiments, a list of error location candidates that includes hypotheses of multiple bit-flips can be chosen. This approach may require a larger list size h when compared to the single bit-flip approach. However, it can reduce the requirements of the DNN solver and improve the robustness under various channel conditions. In this embodiment, the list of candidates may include bit flips of one up to three or four bits, all within a predetermined span of the sorted locations of $\{sLLR_j\}_{j=1}^n$.

Figure 7:
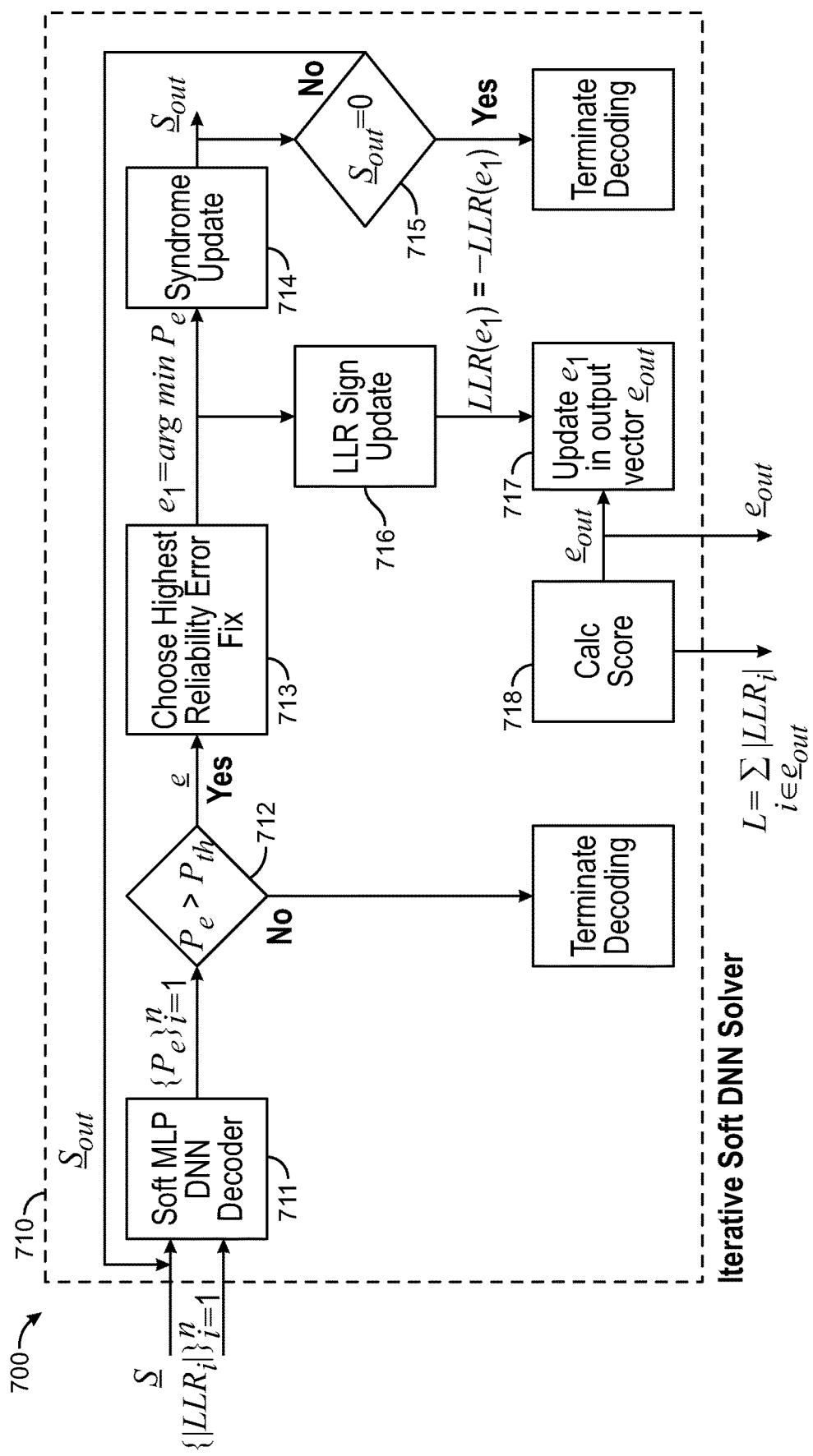
FIG. 7 is an iterative soft neural network solver to perform operations associated with a storage medium, according to some arrangements.
Figure 8:
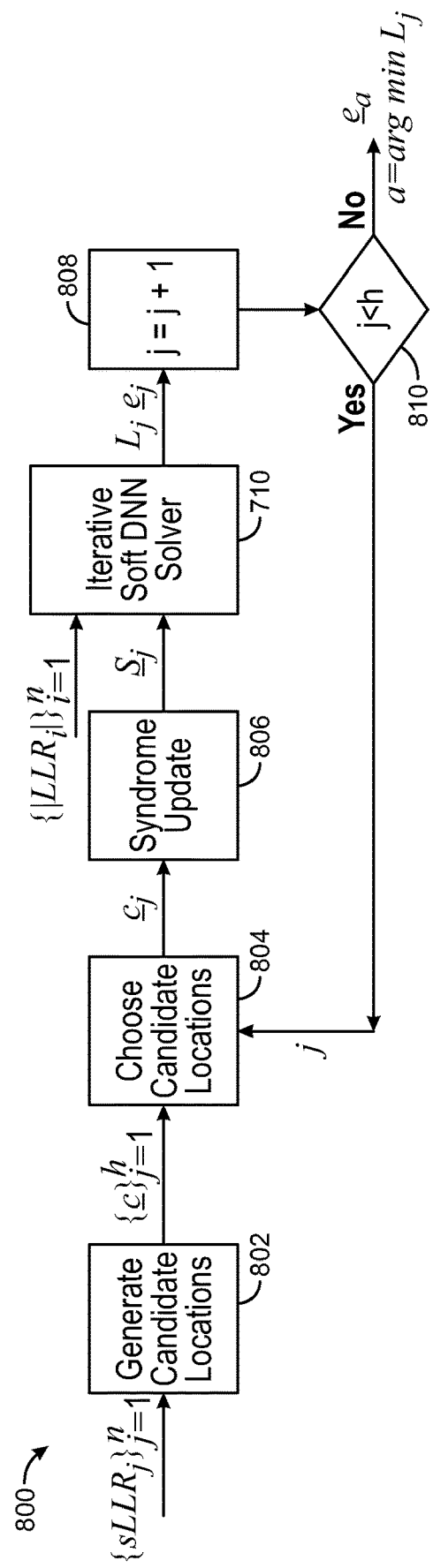
FIG. 8 is the iterative soft neural network solver of FIG. 7 of a BCD code, according to some arrangements.

Referring now to FIG. 7, an iterative soft neural network solver to perform operations associated with a storage medium, according to some arrangements. FIGS. 7-8 includes similar features and functionalities as described in detail with reference to FIGS. 5-6. However, as shown, an iterative DNN solver process for decoding that can apply only a single bit-location fix per iteration until there are no further corrections or until the output syndrome is zero. This iterative decoding method utilizes the confidence information of the DNN solver output (block 711) to select the most likely error suggested by the DNN (block 713), updates the syndrome (block 714), and repeats the DNN decoding (block 711 again) to iteratively converge to its error vector solution while performing only the most confident error fixes each iteration.

In some embodiments, the LLR of a fixed location per iteration may be updated to reflect a modified input reliability to the corrected location (block 716). This modification ensures that the decoder will correct the following bits with greater reliability. For instance, if location j is fixed, it can be updated by $uLLR=c \cdot log(0.5+P_e(j))$, where uLLR is a positive LLR update value that is used to replace the input reliability of the bit at location j, as well as its corresponding updated syndrome. The reliability of this location will now be $|LLR_j|+uLLR$. In some embodiments, multiple error locations are chosen instead of just the most confident fix. This approach involves selecting the m error locations that have the highest probability error and applying a syndrome update computation for these locations. Optionally, the input reliabilities for those bits can be updated accordingly, and then the process proceeds to the next iteration. Overall, these embodiments of FIGS. 7-8 allow for an iterative DNN solver process that can converge to an error vector solution while performing the most confident error fixes at each iteration, updating the syndrome vector and optionally updating the input reliabilities to correct errors with greater reliability. The selection of single or multiple error locations for correction can be chosen based on the channel conditions and desired performance, allowing for flexibility and adaptability in the decoding process.

In some embodiments, an iterative soft DNN solver 710 is a process that uses a neural network with Rectified Linear Unit (ReLU) activation nodes for decoding instead of using an Algebraic BCH solver. In some embodiments, the iterative process applies only a single bit-location fix per iteration, until there are no further corrections, or until the output syndrome is zero. This approach significantly reduces the enumeration complexity for achieving near maximum-likelihood decoding capability, as the DNN solver may correct multiple errors.

At block 711, the iterative soft DNN solver 710 receives the syndrome vector in binary representation and the n reliability inputs of $\{|LLR_i|\}_{i=1}^{n}$. The output of the DNN solver decoder is a reliability per bit (can be obtained from a soft-max operator on the last layer). This output is denoted by the vector $\{\{P_e\}_{i=1n}$ which represents the confidence value of the DNN. At block 712, only locations for which $P_e>0.5$ are defined as candidate errors, and if there are no such locations, the decoding is terminated.

At block 713, if such locations exist, a single $e_1$ location with highest DNN confidence is chosen $e_1=\arg \max P_e$. That is, this approach ensures that the decoder focuses on correcting the most likely errors at each step of the iterative process. For example, for a codeword with 10 bits, the DNN solver can output a vector of reliabilities per bit, $\{P_e\}_{i=1n}=$ (0.1, 0.05, 0.9, 0.7, 0.4, 0.2, 0.3, 0.1, 0.8, 0.6). In this case, the highest DNN confidence is at bit location 3, with a value of 0.9. Therefore, $e_1$ will be set to 3.

At block 714, the syndrome is updated accordingly. That is, the update is based on the error location that is chosen in each iteration. When a candidate error location is selected, the corresponding bit is flipped (block 716) and the updated syndrome is computed based on the new codeword with the flipped bit. At block 715, if the updated syndrome is zero, then the decoding process is complete and the decoded message is considered valid. However, if the updated syndrome is not zero, then another iteration of the DNN solver is performed, with the updated syndrome and input reliability values. This process continues until the syndrome becomes zero or no candidate errors are found. The advantage of updating the syndrome with each iteration is that it provides a way to track the progress of the decoding process. By monitoring the syndrome values, it is possible to determine whether the decoded message is likely to be correct or not. If the syndrome remains non-zero after several iterations, it is an indication that the decoding process may not converge to a valid solution.

Referring to a first iteration, to calculate the syndrome vector s, suppose a parity check matrix H and a received codeword r. Before updating:

$H=[[1, 1, 0, 1], [0, 1, 1, 1], [1, 0, 1, 1]]$ $r=[1, 0, 1, 0]$ $s=H*r$ (matrix multiplication)$=[0, 0, 1]$ In this example, the initial syndrome vector is [0, 0, 1]. After updating, suppose a candidate error location e, with value $e_{val}$, and the syndrome vector is updated based on this error location.

$e=2$ (the second bit is flipped)

$e_{val}=0$ (the new value for this bit after flipping is 0)

$s[e]=s[e]+H[e][j]*e\_val$(element-wise addition)$=[0, 1, 1]$

In this example, the syndrome vector is updated to [0, 1, 1]. The new value at index 1 corresponds to the location that was flipped.

At block 716, the LLR of fixed location per iteration may be updated to reflect a modified input reliability to the corrected location and ensure that the decoder will correct the following bits with greater reliability. For example, if location j is fixed, then it can be updated by $LLR=c \log(0.5+P_e(j))$, where uLLR is a positive LLR update value that is used to replace the input reliability of bit at location j, as well as its corresponding updated syndrome. The reliability of this location will now be $|LLR_j|+uLLR$.

At block 717, after the location $e_1$ with the highest DNN confidence is chosen, it is added to the output vector $e_{out}$ to indicate that the corresponding bit is an error. That is, $e_{out}[e_1]$ is set to 1, while all other elements of $e_{out}$ remain 0. This allows for the tracking of the error locations and their corrections throughout the iterative decoding process. In subsequent iterations, $e_1$ will be updated to indicate the next most confident error location if the decoding has not yet converged. This process continues until the decoder either corrects all errors in the received codeword or the maximum number of iterations is reached. The final $e_{out}$ output vector represents the corrected codeword. Each bit in the vector corresponds to a bit in the received codeword, and a value of 0 or 1 represents the corrected bit value. The vector is the result of applying the iterative soft DNN decoding process to the received codeword, correcting errors one at a time based on the DNN confidence output and the updated syndrome vector, until convergence is achieved or until a maximum number of iterations is reached. The resulting $e_{out}$ vector represents the best estimate of the original transmitted codeword based on the received codeword and the channel noise model.

At block 718, the sum-LLR score is updated for every error location, so that the final score is an accumulation of all error vector LLR absolute values. The iterative soft DNN solver process ensures that the DNN solver iteratively converges to its error vector solution while performing only the most confident error fixes each iteration. This score is calculated as the sum of the absolute LLR values of the locations in $e_{out}$. The final score is an accumulation of all the error vector LLR absolute values, which represents the total confidence of the DNN solver in its solution. The iterative soft DNN solver process is designed to ensure that the DNN solver iteratively converges to its error vector solution while performing only the most confident error fixes each iteration, resulting in an efficient and accurate decoding process.

Referring now to a second iteration, assume that the DNN solver output after the second interaction is:

$$\{P_e\}=[0.85, 0.12, 0.03, 0.01, 0.02, 0.08, 0.75, 0.05, 0.02, 0.92]$$

Based on this output, the candidate error locations would be:

$$\{e\}=[1,9]$$

Since there are candidate error locations, the next step would be to choose the one with the highest DNN confidence, which is:

$$e_1=9$$

The updated syndrome vector based on this candidate would be:

$$S=[1, 1, 1, 0, 0, 0, 0, 1, 1, 0, 0, 0, 0]$$

The updated LLR for location 9 would be:

$$uLLR_9 = c \cdot \log(0.5 + P_e(9)) = 3 \cdot \log(0.5 + 0.92) = 5.06$$

Therefore, the updated LLR for location 9 would be:

$$|LLR_9| + uLLR_9 = 7.8 + 5.06 = 12.86$$

The sum-LLR score for this candidate solution would be:

$$S_{LLR} \triangleq L_j = \sum_{i \in e_j} |LLR_i| + |uLLR_9| = 15.3 + 5.06 = 20.36$$

Since the updated syndrome vector is not zero, the process would continue with the next candidate solution.

In some embodiments, multiple error locations are chosen, not just the most confident fix. That is, from the highest probability error, choose the m error locations that have the highest confidence. For these locations, apply a syndrome update computation and optionally update input reliabilities for those bits accordingly, then proceed to the next iteration. Once these m locations are fixed, the iterative DNN solver proceeds to the next iteration and repeats the process of selecting error locations, updating the syndrome, and fixing the most confident errors until the output syndrome is zero or until the maximum number of iterations is reached.

Referring now to FIG. 8, the iterative soft neural network solver of FIG. 7 of a BCD code, according to some arrangements. FIG. 8 includes similar features and functionality as described in detail with reference to FIG. 6. Using the interactive soft DNN solver 710, error hypotheses as candidates can be generated (block 802), and for each candidate chosen (block 804), the syndrome is updated accordingly (block 806), and an iterative soft DNN solver 710 is used to obtain the complete error vector. The input to the list decoder is the sorted reliabilities of each codeword bit, and a list of candidates is generated by choosing locations with relatively low reliability. In some embodiments, the number of candidates is limited to h, the number of hypotheses. Single error location candidates may be chosen, which means that only a single bit flip per hypothesis is considered. This can be efficient for cases where the iterative DNN solver has high capability and can correct almost all codeword errors. For a candidate j, the channel input syndrome is updated (block 808), and the iterative DNN solver output is an error vector of locations suspected to be erroneous bits (block 810). The soft output here is the sum of reliabilities of the error hypothesis candidate and all DNN solver error locations. If a combined candidate does not result in a "0" syndrome (block 810), then this candidate solution is rejected. Then the candidate counter j is incremented, and the process is repeated for the next solution candidate.

In list decoding with an iterative DNN solver, a list of candidate error locations is generated (block 802) based on the sorted reliability values of each codeword bit. These candidate locations have low reliability, e.g., low $|LLR_j|$. The iterative DNN solver is applied to each candidate location one by one, with the syndrome updated accordingly. The output of the iterative DNN solver is an error vector that contains the locations of bits that are suspected to be erroneous. The sum-LLR score for each candidate solution is updated based on the DNN solver's output. In cases where a combined candidate solution does not result in a "0" syndrome, the candidate solution is rejected. Then, the process is repeated for the next solution candidate, and the candidate counter is incremented. Only single error location candidates can be chosen, or multiple error locations can be considered for each candidate hypothesis. By limiting the number of hypotheses to h, this embodiment can be used to efficiently correct a large number of errors in a received codeword.

Figure 9:
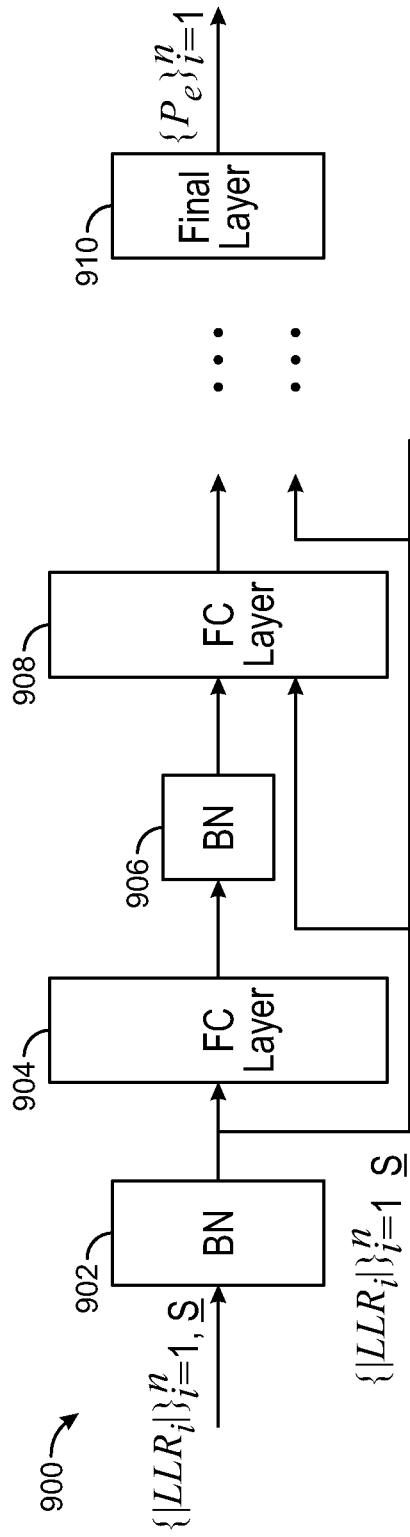
FIG. 9 is a fully connected (FC) DNN for a soft DNN solver and iterative soft DNN decoder, according to some arrangements.

Referring now to FIG. 9, a fully connected (FC) DNN for soft DNN solver 510 of FIG. 5 and iterative soft DNN decoder 710 of FIG. 7, according to some arrangements. In some embodiments, the FC DNN can have optional batch normalization layers (layers 902 and 906), and normalized input can be provided for all hidden layers in the network, $\{|LLR_i|\}_{i=1}^n$ and S. The FC DNN can have a configurable number of neurons per layer and the total number of layers (e.g., layers 904, 908, etc.) depending on the code rate. To train this network, many examples of noisy codewords generated according to the channel model that the decoder needs to support can be used (e.g., as input). The labels for training the network can be vectors that contain "0" for correct hard decision inputs and "1" on erroneous locations, which creates a multiple output binary classification optimization problem. A loss function such as the binary cross entropy loss can be used, which is defined by (Equation 9):

$$\text{Loss} = -\sum_{i=1}^{n} y_i \log P_e(i) + (1 - y_i) \log(1 - P_e(i))$$

where $y_i$ is a label of the i-th location in the actual error vector. This loss can be computed for every input codeword example during the training process.

The output of the final layer 910 is a vector of Pe values, denoted as $\{P_e\}_{i=1}^n$. Each $P_e$ value represents the confidence of the DNN solver in the corresponding bit's reliability. In some embodiments, the values of $P_e$ can be obtained from a softmax activation function that normalizes the output of the final layer to a probability distribution over the n bits of the codeword. The softmax function maps the outputs of the final layer to values between 0 and 1, such that the sum of all values in the output vector is 1. The $P_e$ value for a given bit is interpreted as the probability that the bit is in error, given the input reliability values and the DNN model. The threshold $P_{th}$ is used to determine which bits are suspected to be in error, based on their corresponding $P_e$ value. The higher the value of $P_e$, the more confident the DNN is that the corresponding bit is in error.

Figure 10:
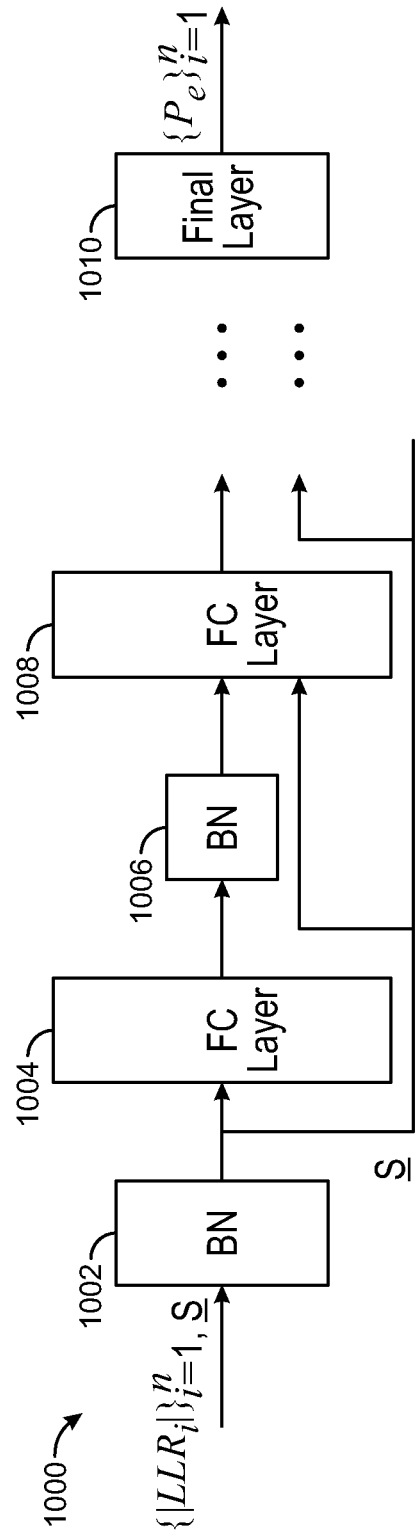
FIG. 10 is another fully connected (FC) DNN for a soft DNN solver and iterative soft DNN decoder, according to some arrangements.

Referring now to FIG. 10, another fully connected (FC) DNN for soft DNN solver 510 of FIG. 5 and iterative soft DNN decoder 710 of FIG. 7, according to some arrangements. In some embodiments, the FC DNN can have optional batch normalization layers (layers 1002 and 1006). The FC DNN can have a configurable number of neurons per layer and the total number of layers (e.g., layers 1004, 1008, etc.) depending on the code rate. In some embodiments, the DNN used for the soft DNN solver and iterative soft DNN decoder receives only the normalized syndrome (S) as input to all hidden layers. That is, reliability values ($\{ILLR_i|\}_{i=1}^n$) are only provided as input to the first layer 1004 of the DNN. This configuration reduces the computational complexity, especially for longer code components. In this configuration, the DNN architecture can be trained in a similar manner as the fully connected DNN with normalized inputs. The network is trained on noisy codeword examples generated according to the channel model that the decoder is intended to support. The labels used in training are vectors with a "0" for correct hard decision inputs and "1" for erroneous locations. This problem can be treated as a binary classification problem with multiple outputs, and a binary cross-entropy loss function can be used during training. During operation, the iterative soft DNN solver process can be applied to the normalized syndrome inputs for every error location candidate to obtain the complete error vector. In some embodiments, the confidence value of the DNN output can be used to select the most likely error and update the syndrome accordingly. This process can be repeated iteratively until there are no further corrections, or until the output syndrome is zero. The output of the final layer 1010 is a vector of $P_e$ values, denoted as $\{P_e\}_{i=1}^n$.

Figure 11:
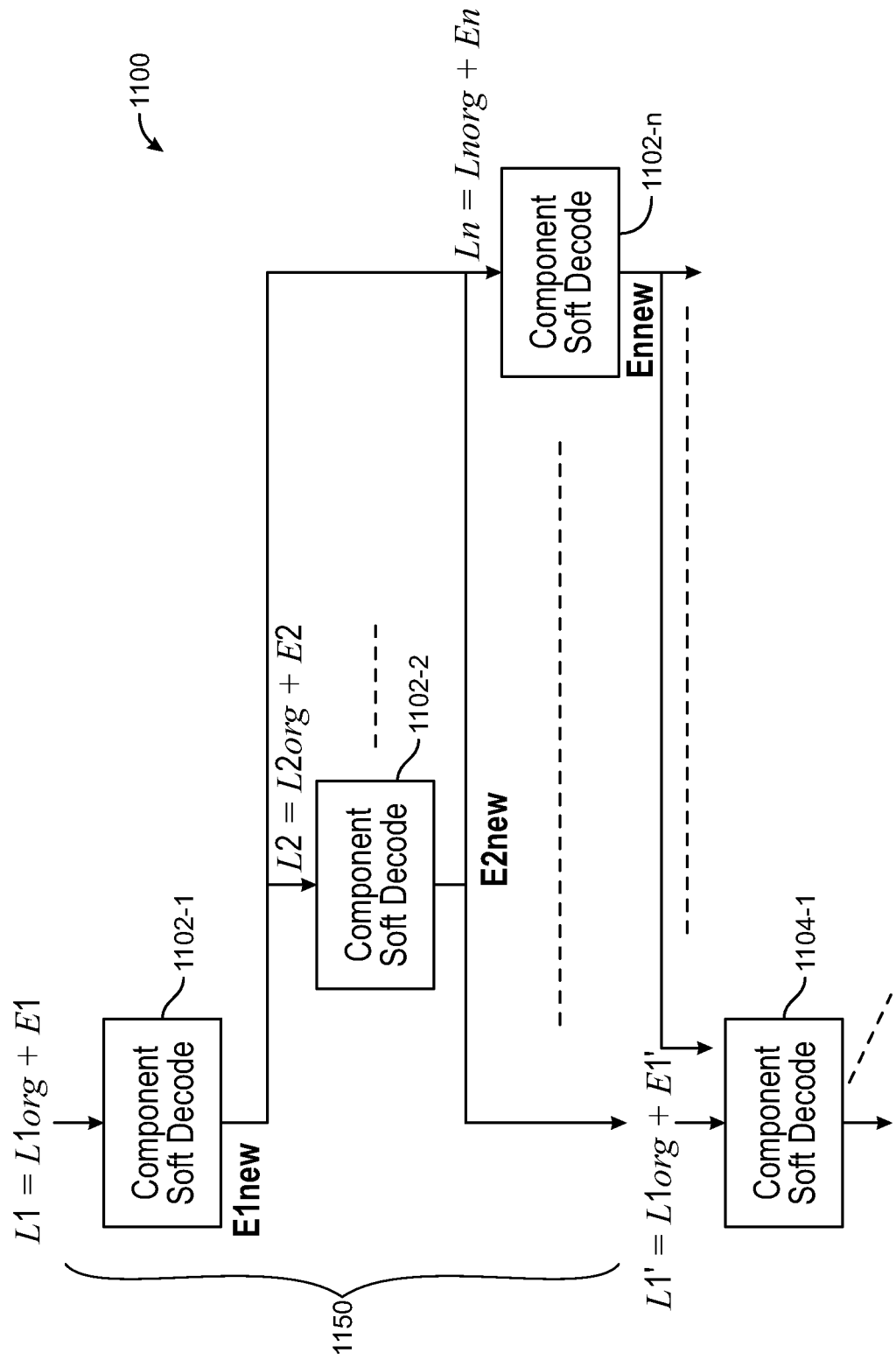
FIG. 11 is a flowchart illustrating an example methodology for sequential soft decoding of HFPC, according to some arrangements.

FIG. 11 is a flowchart illustrating an example methodology for sequential soft decoding of HFPC according to some arrangements. FIG. 11 shows an example sequential iterative soft decoding flow 1100. The flow 1100 may perform soft decoding iterations. For example, in a first iteration (S1150), the flow may perform soft decoding on each component code of n component codes (S1102-1, S1102-2, . . . , S1102-n) until a termination condition is reached. If the termination condition is not met, the flow may perform a second iteration by starting with soft decoding with a first component code (S1104-1).

In soft decoding a component code, a decoder (e.g., the ECC decoder 102 in FIG. 1) may take an LLR value as an input and calculate an extrinsic value as an output. Each (computed) LLR value can be expressed as the sum of (1) an intrinsic value and (2) an extrinsic value. The intrinsic value is available at the channel output before any decoding stage, and the extrinsic value is provided by exploiting the dependencies existing between the component being processed and the other component codes processed by the decoder. For example, in soft decoding a component code 1 (S1102-1), the decoder may input LLR value L1 which is expressed as the sum of (1) intrinsic value L1org and (2) extrinsic value E1, and output a new extrinsic value E1new. This new extrinsic value outputted at S1102-1 may affect decoding results of other component codes in their soft decoding steps (e.g., S1102-2 to S1102-n).

Now, a sequential iterative soft decoding of HFPC code will be described in more detail. In some arrangements, sequential iterative soft decoding may be performed to obtain high performance of soft decoding. In some arrangements, a decoder may perform the following three steps (Step 1, Step 2, and Step 3) for an iterative sequential decoding for HFPC. In Step 1, the decoder may create a list of unsolved component codes, e.g., by choosing components with a non-zero syndrome in BCH codes.

In Step 2, for each component for decoding, the decoder may perform the following sub-steps (a)-(d). In sub-step (a), the decoder may perform enumeration of hypothesis and solve every hypothesis e.g., using a BCH solver. In sub-step (b), for every valid candidate codeword C, the decoder may compute a score $S_{LLR}(C)$ according to Equation 16 described below. In sub-step (c), the decoder may save a best score $S_1$ and a second best score $S_2$, defined as follows (Equations 10, 11, and 12, respectively):

$$S_1 = \min_{C \in L} S_{LLR}(C)$$

$$C_{ML} = \arg\min_{C \in L} S_{LLR}(C)$$

$$S_2 = \min_{C \in L, C \neq C_{ML}} S_{LLR}(C)$$

where L is a valid codeword list, and $C_{ML}$ is a most likely codeword.

In sub-step (d), the decoder may compute an extrinsic value output for the component of the most likely codeword $C_{ML}$ based on the scores $S_1$ and $S_2$. The extrinsic value may be used to modify channel LLR values (e.g., intrinsic values) which are used by all other components in the following manner: (i) the LLR sign may be kept identical to input LLR sign; (ii) the LLR sign may be flipped on bit location specified in $C_{ML}$, and a sign vector of codeword may be updated (updated sign vector of codeword is denoted by S); and/or (iii) extrinsic output vector E may be calculated or given by (Equation 8):

$$E = e(S_1, S_2) \cdot S$$

where e(S1,S2) is a scalar corresponding to the reliability associated with the maximal likelihood solution $C_{ML}$. $S_1$ and $S_2$ are from Equations 10 and 12, respectively, and correspond to the candidate codewords which have a best score (from Equation 10) and a second best score (from Equation 12).

In sub-step (d), the extrinsic output vector E of the target component may be added to channel input LLRs of corresponding bits, to be used by all other components which are dependent on that codeword in associated location.

In Step 3, as step 2 is applied to each component, the decoder may check termination (success) condition, after every component decoding is done. The decoder may repeat Steps 1-3 until success, or max-iteration count is reached (which means failure). These steps for sequential soft decoding are illustrated in FIG. 5, where the result of each component extrinsic values are fed to all other dependent components. In HFPC, all other components may be dependent and also benefit from the updated extrinsic values.

Figure 12:
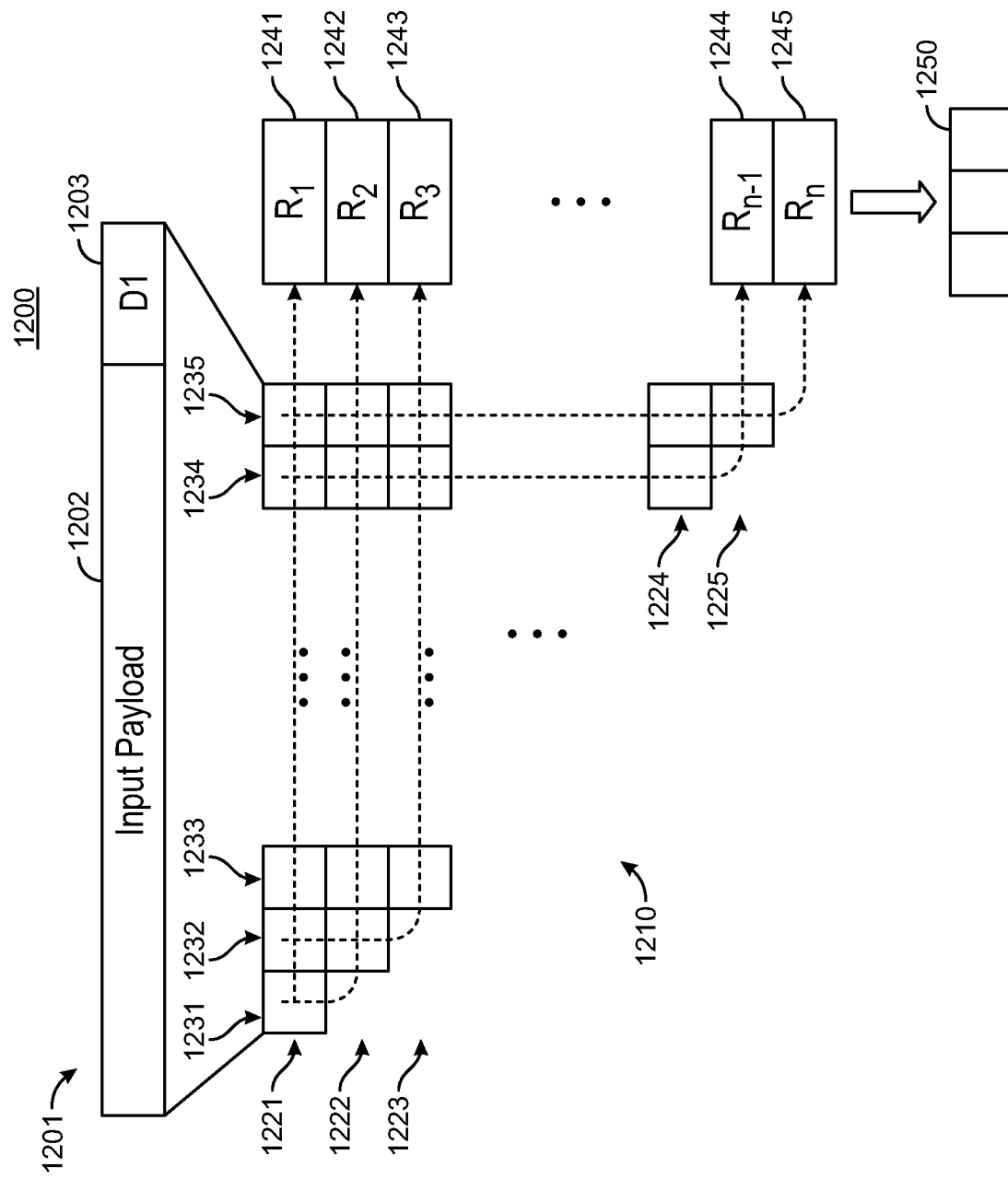
FIG. 12 is a diagram illustrating a mapping in an encoding process using a half folded-product code (HFPC) structure, according to some arrangements.
Figure 13:
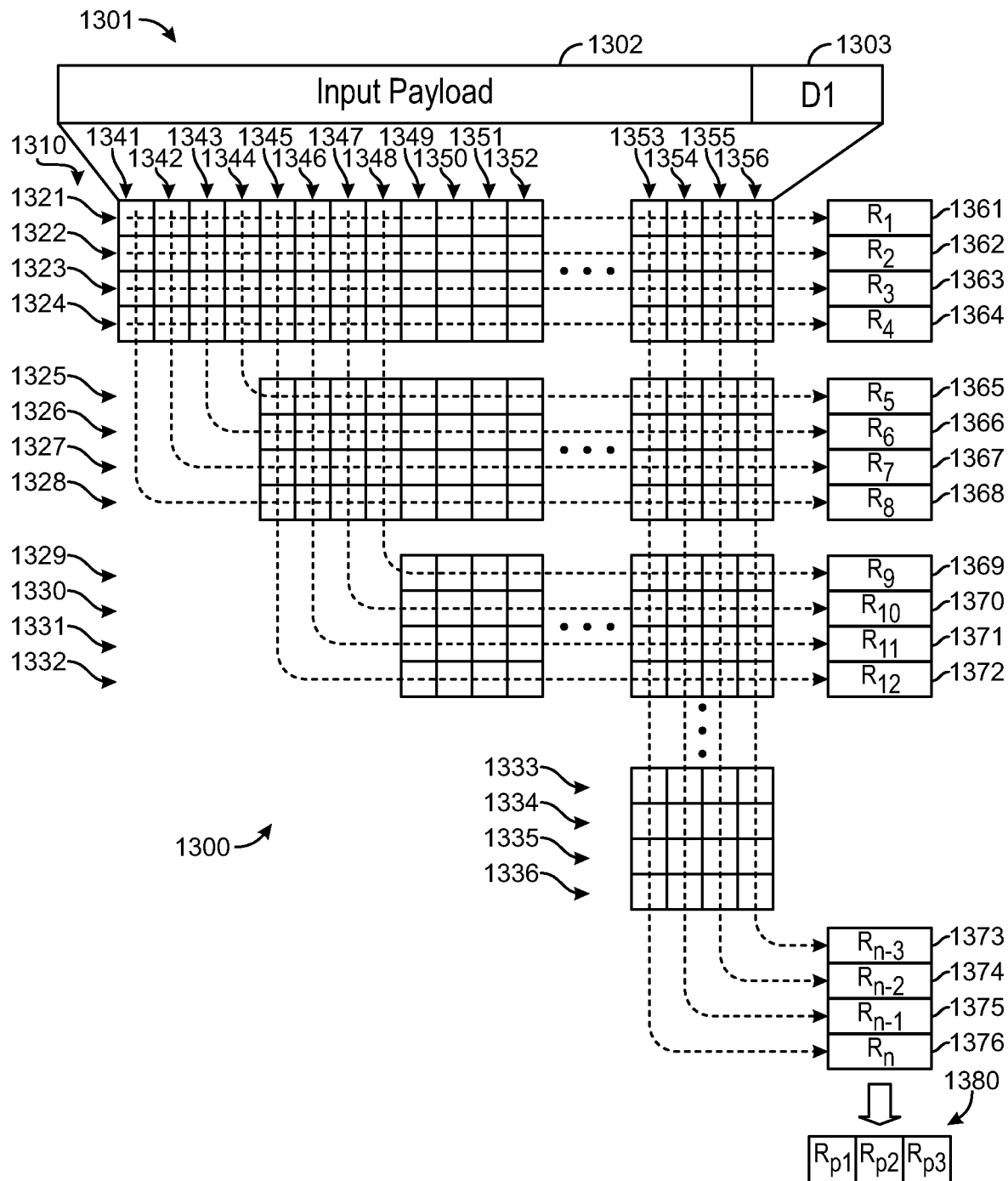
FIG. 13 is a diagram illustrating a mapping in an encoding process using a group HFPC structure, according to some arrangements.

FIG. 12 is a diagram illustrating a mapping 1200 in an encoding process using a HFPC structure according to various implementations. Referring to FIGS. 1 and 12-13, the mapping 1200 corresponds to the HFPC encoding scheme. An encoding/decoding (ED) system (e.g., controller 110 including one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 1201 into a form of a pseudo triangular matrix 1210. The input bits 1201 include input payload 1202 and signature bit(s) D1 1203 in some examples. The input payload 1202 includes the information bits. In some examples, the input payload 1202 includes information bits and redundancy bits introduced by the host 101 for RAID or erasure encoding (e.g., by the one or more ECC encoders of the ECC encoder/decoder 102). As described, an example of D1 1203 is the extra CRC bits. The bits of D1 1203 can also be referred to as "outer parity bits," given that CRC encoding can be viewed as an outer encoding process. The mapping from the input bits 1201 to the pseudo triangular matrix 1210 is maintained by the ED system.

As shown, the pseudo triangular matrix 1210 has an upper triangular form, which has rows 1221-1225 (with rows between rows 1223 and 1224 omitted for clarity) and column 1231-1235 (with columns between columns 1233 and 1234 omitted for clarity). The pseudo triangular matrix 1210 is shown to have multiple blocks. Each block in the pseudo triangular matrix 1210 includes or otherwise represents two or more bits of the input bits 1201. The number of input bits per each block can be predetermined and equal for all the blocks of the pseudo triangular matrix 1210. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 1210 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits.

In some implementations, the input bits 1201 are mapped to a block in the pseudo triangular matrix 1210 consecutively (by any suitable order). For example, the rows 1221-1225, in that order or in a reverse order, can be filled by the input bits 1201 consecutively block by block, from the left-most block of a row to a right-most block of a row, vice versa. In another example, the columns 1231-1235, in that order or in a reverse order, can be filled by the input bits 1201 consecutively block by block, from the top-most block of a column to a bottom-most block of a row, vice versa. In some implementations, the input bits 1201 are mapped to the pseudo triangular matrix 1210 pseudo-randomly. In other implementations, the input bits 1201 can be mapped to the pseudo triangular matrix 1210 using another suitable mapping mechanism. In one arrangement, the mapping is a one to one mapping, where each bit of the input bits 1201 is mapped to one bit of the pseudo triangular matrix 1210 and the total number of bits in the pseudo triangular matrix 1210 is equal to the number of input bits 1201. In another arrangement, the mapping may be one to many, where each bit of the input bits 1201 is mapped to one or more bits of the pseudo triangular matrix 1210 and the total number of bits in the pseudo triangular matrix 1210 is greater than the number of input bits 1201.

As shown, the upper triangular form has a same number of columns and a same number of rows. In the upper triangular form, the row 1221 contains the most bits out of all the rows in the pseudo triangular matrix 1210. The row 1222 has one less block than the row 1221. The row 1223 has one less block than the row 1222, and so on. The row 1224 has two blocks, and the row 1225, being the lowest row, has one block. In other words, any row in the pseudo triangular matrix 1210 (except for the row 1221) has one block less than the row immediately above. Similarly, in the upper triangular form, the column 1231, being the left-most column, has one block. The column 1232 has one more block than the column 1231. The column 1233 has one more block than the column 1232, and so on. The column 1235, being the right-most column, has the most blocks out of the columns in the pseudo triangular matrix 1210. In other words, any column in the pseudo triangular matrix 1210 (except for the column 1235) has one block less than the column immediately to the right.

Organizing or mapping the input bits 1201 (which includes the bits of the input payload 1202 and signature bit(s) D1 1203) in the upper triangular form of the pseudo triangular matrix 1210 allows every component code to be associated with bits in a row and a column that have the same size or nearly the same size in the manner described. For example, R1 1241 represents redundancy bits corresponding to a first component code. R1 1241 redundancy bits are obtained by encoding (e.g., folded component encoding) the input bits 1201 in a first row (e.g., the bits in the row 1221). R2 1242 redundancy bits are obtained by encoding (e.g., via folded component encoding) the input bits 1201 in a first column (e.g., the bits in the column 1231) and the second row (e.g., the bits in the row 1222). The number of total bits (e.g., the bits in the column 1231 plus the bits in the row 1222) encoded by R2 1242 are the same as the number of total bits (e.g., the bits in the row 1221) encoded by R1 1241. R3 1243 redundancy bits are obtained by encoding (e.g., via folded component encoding) the input bits 1201 in a second column (e.g., the bits in the column 1232) and the third row (e.g., the bits in the row 1223). The number of total bits (e.g., the bits in the column 1232 plus the bits in the row 1223) encoded by R3 1243 are the same as the number of total bits encoded by R2 1242 (as well as the number of total bits encoded by R1 1241). This process continues to obtain the last redundancy bits Rn 1245, which encodes (e.g., via folded component encoding) the input bits 1201 in the last column (e.g., the bits in the column 1235). Thus, each component code encodes a row and a column in the pseudo triangular matrix 1210, providing folded component encoding. An example of the folded component encoding is folded BCH encoding.

In other words, according to the mapping 1200, the input bits 1201 are mapped to the component codes of the ECC and are encoded as the mapped component codes. For example, the encoding process organizes or maps the input bits 1201 into a matrix (e.g., the pseudo triangular matrix form), and performs folded BCH encoding for every component code. Each of the input bits 1201 is encoded by two component codes. Each component code intersects with all other component codes. For component codes that encode the input bits 1201, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 1243 redundancy bits are also encoded by other component codes corresponding to R1 1241, R2 1242, and R4-Rn 1245. The bits at intersection of the row 1221 and the column 1232 are also encoded by the component code corresponding to R1 1241; the bits at the intersection of the row 1222 and the column 1232 are also encoded by the component code corresponding to R2 1242; the bits at the intersection of the row 1223 and the column 1234 are also encoded by the component code corresponding to Rn-1 1244; the bits at the intersection of the row 1223 and the column 1235 are also encoded by the component code corresponding to Rn 1245. Each block of bits encoded by any of the component code (e.g., the component code corresponding to the R3 1243) is encoded by that component code (e.g., the component code corresponding to the R3 1243) and no more than another one of the component codes, hence in a non-overlapping manner. As such, every component code is mutually dependent on all other component codes. The component codes together provide the encoding of each of the input bits 1201 using two component codes. The component codes have the same code rate given that each component code encodes a same number of bits.

In some implementations, parity bits can be generated via parity encoding. For example, folded parity encoding can be used to encode at least a portion of each of R1 1241-Rn 1245 into another component code (e.g., a folded product code 1250, which is a set of packets). The folded product code 1250 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 1241-Rn 1245 is encoded to obtain the folded product code 1250. This is because only the encoded versions of the input bits 1201 (e.g., the input payload 1202) needs to be decoded—decoding all of the redundancy bits R1 1241-Rn 1245 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIGS. 12-13, an additional encoding process can be applied to some of the input bits 1201 by encoding those bits with a different set of component codes. In some examples, the irregularity of the encoding process is caused by some of the input bits 1201 being encoded by more than two component codes while other bits of the input bits 1201 are encoded by two component codes, creating an unequal error protection of the bits within the codeword and resulting in improved correction capabilities (as applied to iterative decoding).

The redundancy bits R1 1241-Rn-m 1245 generated from the HFPC encoding process described with respect to FIG. 12 can be encoded by another, separate set of component codes used to encode all or a subset of these redundancy bits by another set of component codes. This forms a folded product code encoding over the redundancy bits R1 1241-Rn-m 1245, which, together with the information bits encoding, results in a low complexity encoding process.

As shown, the bits for each component code depend on the bits for another component code during decoding in the ECC structure corresponding to the mapping 1200. For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes. In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

In that regard, FIG. 13 is a diagram illustrating a mapping 1300 in an encoding process using a group HFPC structure according to various implementations. Referring to FIGS. 1 and 12-13, the mapping 1300 corresponds to the group HFPC encoding scheme. The HFPC interleaver of ED system (e.g., controller 110 including one or more ECC encoders of the ECC encoder/decoder 112) or the host 101 (e.g., one or more ECC encoders of the ECC encoder/decoder 102) is configured to organize (e.g., interleave) input bits 1301 into a form of a pseudo triangular matrix 1310. The input bits 1301 includes input payload 1302 and signature bit(s) D1 1303 in some examples. The input payload 1302 includes the information bits. As described, an example of D1 1303 is the extra CRC bits (outer parity bits). The mapping from the input bits 1301 to the pseudo triangular matrix 1310 is maintained by the ED system.

As shown, the pseudo triangular matrix 1310 has an upper triangular form, which has rows 1321-1336 (with rows between rows 1332 and 1333 omitted for clarity) and columns 1341-1356 (with columns between columns 1352 and 1353 omitted for clarity). The pseudo triangular matrix 1310 is shown to have multiple blocks. Each block in the pseudo triangular matrix 1310 includes or otherwise represents two or more bits of the input bits 1301. The number of input bits per each block can be predetermined and equal for all the blocks of the pseudo triangular matrix 1310. The disclosed implementations allow intersection of two or more common bits for any pair of component codes.

In some implementations, the input bits 1301 are mapped to blocks in the pseudo triangular matrix 1310 consecutively (by any suitable order). For example, the rows 1321-1336, in that order or in a reverse order, can be filled by the input bits 1301 consecutively block-by-block, from the left-most block of a row to a right-most block of a row, or vice versa. In another example, the columns 1341-1356, in that order or in a reverse order, can be filled by the input bits 1301 consecutively block-by-block, from the top-most block of a column to a bottom-most block of a row, or vice versa. In some implementations, the input bits 1301 are mapped to the pseudo triangular matrix 1310 pseudo-randomly. In other implementations, the input bits 1301 can be mapped to the pseudo triangular matrix 1310 using another suitable mapping mechanism.

The blocks, rows, and columns in the pseudo triangular matrix 1310 can be grouped together. For example, the pseudo triangular matrix 1310 includes a first group of columns 1341-1344, a second group of columns 1345-1348, a third group of columns 1349-1352, ..., and another group of columns 1353-1356. The pseudo triangular matrix 1310 includes a first group of rows 1321-1324, a second group of rows 1325-1328, a third group of rows 1329-1332, ..., and another group of rows 1333-1336. Thus, the HFPC structure is divided into groups of 13 component codes. Every 4 component codes are encoded according to HFPC guidelines. Although 4 component code groups (e.g., 4 rows/columns) are shown in FIG. 13, any number (e.g., 2, 3, 6, 8, 10, 12, 16, and so on) of component codes can be grouped together.

As shown, the upper triangular form has a same number of columns and a same number of rows. The rows (e.g., the rows 1321-1324) or columns (e.g., the columns 1341-1344) in a same component code group have a same number of blocks and therefore have a same number of bits. In the upper triangular form, the rows 1321-1324 contain the most bits out of all the rows in the pseudo triangular matrix 1310. Each of the rows 1325-1328 has one less group of blocks (4 blocks, corresponding to the group of columns 1341-1344) than any of the rows 1321-1324. Each of the rows 1329-1332 has one less group of blocks (4 blocks, corresponding to the group of columns 1345-1348) than any of the rows 1325-1328, and so on. Each of the rows 1333-1336, being the lowest row, has a group of blocks (e.g., 4 blocks). In other words, any row in the pseudo triangular matrix 1310 (except for the rows 1321-1324) has 4 blocks less than a row of a group immediately above. Similarly, in the upper triangular form, each of the columns 1341-1344, being one of the left-most columns, has a group of blocks (e.g., 4 blocks). Each of the columns 1345-1348 has one more group of blocks (4 blocks, corresponding to the group of rows 1325-1328) than any of the columns 1341-1344. Each of the columns 1349-1352 has one more group of blocks (4 blocks, corresponding to the group of rows 1329-1332) than any of the columns 1345-1348, and so on. Each of the columns 1353-1356, being the right-most columns, has the greatest number of blocks. In other words, any column in the pseudo triangular matrix 1310 (except for the columns 1353-1356) has 4 blocks less than a column of a group immediately to the right.

Organizing or mapping the input bits 1301 in the upper triangular form of the pseudo triangular matrix 1310 allows every component code to be associated with bits in a row and a column that have the same size or nearly the same size in the manner described. The component codes within a same group encode separate sets of the input bits 1301 and are independent of each other.

R1 1361-R4 1364 are redundancy bits determined based on a same group of component codes. R1 1361 represents redundancy bits corresponding to a first component code and are obtained by encoding (e.g., folded component encoding) the input bits 1301 in a first row (e.g., the bits in the row 1321). R2 1362, R3 1363, and R4 1364 represent redundancy bits corresponding to additional component codes and are obtained by encoding (e.g., folded component encoding) the input bits 1301 in the bits in the rows 1322, 1323, and 1323, respectively. The bits used to determine each of R1 1361-R4 1364 do not overlap, and thus R1 1361-R4 1364 are independently determined.

R5 1365, R6 1366, R7 1367, and R8 1368 represent redundancy bits corresponding to additional component codes and are obtained by encoding (e.g., folded component encoding) the input bits 1301 in the bits in the column 1344 and row 1325, in the column 1343 and row 1326, in the column 1342 and row 427, and in the column 1341 and row 1328, respectively. The bits used to determine each of R5 1365-R8 1368 do not overlap, and thus R5 1365-R8 1368 are independently determined.

R9 1369, R10 1370, R11 1371, and R12 1372 represent redundancy bits corresponding to additional component codes and are obtained by encoding (e.g., folded component encoding) the input bits 1301 in the bits in the column 1348 and row 1329, in the column 1347 and row 1330, in the column 1346 and row 1331, and in the column 1345 and row 1332, respectively. The bits used to determine each of R9 1369-R12 1372 do not overlap, and thus R9 1369-R12 1372 are independently determined.

This process continues until Rn-3 1373, Rn-2 1374, Rn-1 1375, and Rn 1376 are determined. Rn-3 1373, Rn-2 1374, Rn-1 1375, and Rn 1376 represent redundancy bits corresponding to additional component codes and are obtained by encoding (e.g., folded component encoding) the input bits 1301 in the bits in the column 1356, in the column 1355, in the column 1354, and in the column 1353, respectively. The bits used to determine each of Rn-3 1373, Rn-2 1374, Rn-1 1375, and Rn 1376 do not overlap, and thus Rn-3 1373, Rn-2 1374, Rn-1 1375, and Rn 1376 are independently determined. An example of the folded component encoding is folded BCH encoding. In the special case that the component codes are divided into two groups of independent component codes, the resulting coding scheme degenerates to a folded product code.

According to the mapping 1300, the input bits 1301 are mapped to the component codes of the ECC and are encoded as the mapped component codes. For example, the encoding process organizes or maps the input bits 1301 in a matrix (e.g., a pseudo triangular matrix form), and performs folded BCH encoding for every component code. Each of the input bits 1301 is encoded by two component codes of different component code groups. Thus, any component code intersects with all other component codes that are in the same group as the group to which that component code belongs. For component codes that encode the input bits 1301, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 1369 redundancy bits are also encoded by other component codes corresponding to R1 1361-R8 1368 and R11-Rn 1376 that are not in the group in which the component code corresponding to R9 1369 redundancy bits belongs. Each block of bits encoded by any of the component code (e.g., the component code corresponding to the R9 1369) is encoded by that component code (e.g., the component code corresponding to the R9 1369) and no more than another one of the component codes, hence in a non-overlapping manner. As such, every component code is mutually dependent on all other component codes that are not within the same group. The component codes together provide the encoding of each input bits 1301 using two component codes.

In some implementations, parity bits can be generated via parity encoding. For example, folded parity encoding can be used to encode at least a portion of each of R1 1361-Rn 1376 into another component code (e.g., a folded product code 1380, which is a set of packets). The folded product code 1380 (e.g., having Rp1-Rp3) is the parity bits. This method of generating the parity bits can be efficient for obtaining simple hardware encoding implementations of HFPC, as the method can be iteratively decoded using various methods of hard or soft decoding.

While a hard decoder decodes a message based on received bits (based on hard decision), soft input can be obtained by soft sampling, e.g., performing multiple reads from a flash device, where each read operation uses a different one of the read thresholds. The read thresholds can be configured such that soft information or soft metrics such as but not limited to, a log-likelihood ratio (LLR), can be computed per bit. An LLR is defined as (Equation 13):

$$LLR(b_i) = \log\left(\frac{P(b_i = 1 \mid y)}{P(b_i = 0 \mid y)}\right)$$

where y is a channel output and $b_i$ is the $i^{th}$ bit of a page. The LLR expression can be substantially simplified in some examples, for an additive white Gaussian noise (AWGN) channel model. The AWGN can be used to approximate lobes' distribution in a flash device. By assuming an AWGN channel (Equation 14):

$$P(b_i \mid y) = \frac{1}{\sqrt{2\pi\sigma^2}} \exp\left(-\frac{(y - b_i)^2}{2\sigma^2}\right)$$

where y is the AWGN channel output. Therefore, in some examples, the $LLR(b_i)$ becomes (Equation 15):

$$LLR(b_i) = \frac{2y}{\sigma^2}$$

where the LLR per bit is created during multiple flash reads, as a quantized version of an AWGN channel. In some arrangements, the quantization level per threshold can be directly determined by the number of reads, as a base-two logarithm of a read counter.

After multiple reads have been conducted, and once LLRs are available for all codeword bits, a decoding process may begin. There can be many possible approximations for mapping of LLR values' for implementation efficiency, such as mapping to fixed point integer values. A product code corresponds to an n×n array in which each column and row is a codeword in component code. Several known decoding algorithms can be used for a product code when soft information is available to a decoder. The general approach includes decoding each component code separately to generate output reliabilities per bit, which is applied and used for iterative decoding of the component code. For example, soft decoding of a BCH component code needs soft information per bit. Iterative soft decoding includes a process of performing soft decoding on some of component codes, and applying the most likely corrections under different conditions. One approach for soft decoding is enumeration over low reliability bits, while trying to solve the BCH code per hypothesis. Other approaches include enumeration on least reliable bits together with assumptions that all errors are within a set of Q×t bits and performing erasure decoding, where t is the number of correctable bits (e.g., t=3), Q stands for the Galois field ($2^Q$) that is used for the code elements (e.g., Q=10). Q and t are parts of the parameters of the code, and Q×t is the number of parity bits of the codeword. This approach is known as ordered statistics decoding.

If the BCH component codes with decoding capability of t<4 are used, soft decoding can be efficiently implemented in terms of computational complexity, or implemented in hardware implementation, as per hypothesis a solution can directly be computed using a syndrome lookup table (LUT). Performing any type of soft decoding for a component code includes creating a list of candidates of the most likely error hypotheses for valid codeword corrections. A soft score for every result of valid codeword can be computed by (Equation 16):

$$S_{LLR} = \sum_{b_m \in C} |LLR(b_m)|$$

where C is the set of error bits, and $b_m$ is a location of an error bit. In some examples, the selected error hypothesis of a soft component decoder has the smallest $S_{LLR}$ score.

Figure 14:
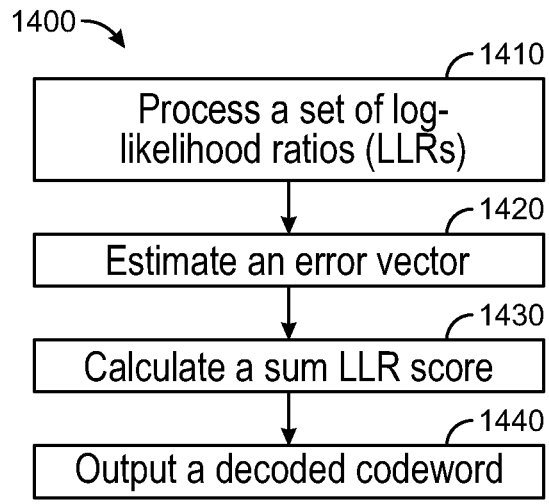
FIG. 14 is a flowchart for a method to perform operations associated with a storage medium, according to some arrangements.

FIG. 14 is a flowchart for a method to perform operations associated with a storage medium, according to some arrangements. An encoding/decoding (ED) system, such as controller 110 of non-volatile storage device 100 or controller 202, can be configured to perform method 1400. Further, any computing device described herein can be configured to perform method 1400.

In broad overview of method 1400, at block 1410, the ED system can process (or analyze) a set of log-likelihood ratios (LLRs). At block 1420, the ED system can estimate an error vector. At block 1430, the ED system can calculate a sum LLR score. At block 1440, the ED system can output a decoded codeword. Additional, fewer, or different operations may be performed depending on the particular arrangement. In some embodiments, some or all operations of method 1400 may be performed by controller 110 or other systems described herein. In various embodiments, each operation may be re-ordered, added, removed, or repeated. In some arrangements, blocks can be optionally executed by the controller 202. In some embodiments, method 1400 is further described above with reference to FIGS. 5-6.

At block 1410, the ED system can analyze (or model using a trained model) a set of log-likelihood ratios (LLRs) and a syndrome vector to obtain a set of confidence values for each bit of a codeword. The LLRs provide an estimate of the likelihood that each bit in the codeword is a one or a zero. The syndrome vector is a binary vector that represents the parity check equations of the code. By comparing the received codeword to the expected parity check equations, the syndrome vector can identify errors in the received codeword. Using the LLRs and the syndrome vector, the ED system then generates a set of confidence values for each bit in the codeword. These confidence values are obtained by applying a soft decoding algorithm, such as an iterative DNN solver, to the LLRs and the syndrome vector. The output of the soft decoding algorithm is a vector of probabilities, denoted as $\{P_e\}_{i=1}^n$, where each element represents the probability that the corresponding bit in the codeword is in error. It should be understood that analyzing (or processing) can include modeling, using a trained model, a set of log-likelihood ratios (LLRs) and a syndrome vector to obtain a set of confidence values.

In some embodiments, the ED system can obtain (or receive), by a soft sampling based on issuing multiple page-reads on a channel, the set of LLRs representing codeword bits of the codeword, wherein the set of LLRs are absoluted prior to analyzing the set of LLRs, wherein the channel is an additive noise channel and determine the syndrome vector for the received codeword based on a parity check matrix and a hard decision vector of a channel output of the channel, wherein the ED system analyzes the set of LLRs based on the syndrome vector being above zero, wherein the syndrome vector is further determined based on the hard decision vector being multiplied by the parity check matrix. That is, the set of LLRs represents the codeword bits of the received codeword and is first converted to the absolute value prior to analyzing (e.g., using a trained model). The channel may be an additive noise channel which can introduce errors in the codeword. To detect these errors, the ED system determines the syndrome vector for the received codeword based on a parity check matrix and a hard decision vector of the channel output. The syndrome vector is used to identify the error locations in the received codeword. In order to improve the accuracy of error detection, the ED system analyzes the set of LLRs based on the syndrome vector being above zero. This means that the ED system only considers the error locations for which the parity check equation is not satisfied. The syndrome vector is determined by multiplying the hard decision vector by the parity check matrix, and the resulting syndrome vector is used to update the set of LLRs. The updated set of LLRs represents the confidence values of each bit of the received codeword.

In some embodiments, the syndrome vector corresponds to a difference between an expected parity check value and an actual parity check value, and wherein each value per bit of the set of LLR values is a scaled version of the channel output of the channel, and wherein the decoded codeword includes a sum of reliabilities of all error locations. The difference between the expected and actual parity check values, also known as the syndrome vector, indicates the error pattern in the received codeword. In some embodiments, each value per bit of the set of LLR values can be a scaled version of the channel output of the additive noise channel, where a larger magnitude of LLR value indicates a higher reliability of the corresponding bit being an error. The decoded codeword includes a sum of reliabilities of all error locations, where the reliabilities are the absolute values of the corresponding LLR values for the error locations.

Furthermore, the hard decision vector includes binary values for each bit of the codeword, and wherein the parity check matrix is an m by n (m×n) matrix where m is a number of check equations and n is a length of the codeword. In some embodiments, the actual parity check value is obtained by applying the parity check matrix to the hard decision vector of the channel output, where a value of 1 indicates an error in the corresponding bit position. The hard decision vector includes binary values for each bit of the codeword, indicating whether the corresponding bit is 0 or 1. The parity check matrix represents the linear constraints on the codeword such that the dot product of the codeword and the matrix results in a vector of zeros, corresponding to a valid codeword.

In some embodiments, in the case of multiple errors being considered, for each selected candidate error location, the syndrome is updated by adding the binary representation of the error vector to the current syndrome vector. After the updated syndrome vector is generated, it is used as input to the soft DNN solver to obtain the complete error vector for the candidate error location. This process is repeated for each candidate error location, resulting in a set of possible solutions, each corresponding to a different combination of error locations. In some embodiments, analyzing (or processing) includes using a trained model, wherein the trained model is a fully-connected (FC) deep neural network (DNN) comprising rectified linear unit (ReLU) activation nodes, and wherein the analyzing further includes executing a softmax function to obtain the set of confidence values for each bit of the codeword.

In some embodiments, the ED system can (1) generate a plurality of candidate locations based on reliabilities of each bit of the codeword of a sorted set of LLRs of the set of the LLRs, wherein generating the plurality of candidate locations comprises independently analyzing (or processing) each LLR of the sorted set of LLRs, (2) choose a first subset of candidate locations of the plurality of candidate locations within a first span of the sorted set of LLRs, wherein the chosen first subset of candidate locations corresponds to a plurality of first lowest LLRs of the sorted set of LLRs, and wherein each candidate location of the first subset of candidate locations is a bit-flip candidate, and (3) update the syndrome vector based on the chosen first subset of candidate locations. That is, the ED system analyzes each LLR of the sorted set of LLRs independently and generates a plurality of candidate locations based on the reliabilities of each bit of the codeword. Then, the ED system chooses a first subset of candidate locations from the plurality of candidate locations within a first span of the sorted set of LLRs. The chosen first subset of candidate locations corresponds to a plurality of first lowest LLRs of the sorted set of LLRs, and each candidate location of the first subset of candidate locations is a bit-flip candidate. In some embodiments, performing the operations associated with the storage medium includes soft BCH decoding where the codeword is BCH component code.

After selecting the first subset of candidate locations, the ED system updates the syndrome vector based on the chosen first subset of candidate locations. This can be done by adding binary representations of the error vector obtained by applying hard decision decoding to the first subset of candidate locations to the original syndrome vector. If the updated syndrome vector is non-zero, the ED system may proceed to generate a second subset of candidate locations and repeat the process of choosing the candidate locations with the lowest LLRs and updating the syndrome vector. This process is repeated until a valid decoded codeword is obtained or all candidate solutions have been considered and none of them resulted in a valid codeword. Finally, the ED system outputs the decoded codeword based on the estimated error vector and the sum LLR score.

In some embodiments, the syndrome vector is associated with a candidate counter that tracks the number of candidate solutions that have been considered. As the first subset of candidate locations is analyzed, for each candidate location of the first subset of candidate locations in the syndrome vector, a counter is incremented by one. This counter is used to ensure that all candidate solutions are considered before determining that no valid codeword has been found. In this way, the ED system can ensure that all potential solutions are analyzed and the most likely error pattern is selected based on the sum-LLR score. By considering all possible candidate solutions, the ED system can maximize the chances of finding a valid decoded codeword.

Expanding generally on the counters, after the first subset of candidate locations has been chosen and the syndrome vector has been updated, the ED system can check if the counter associated with the syndrome vector is below a maximum number of candidate solutions. If the counter is below the maximum number of candidate solutions, the ED system can then choose a second subset of candidate locations within a second span of the sorted set of LLRs, based on the second lowest LLRs of the sorted set of LLRs. The second subset of candidate locations can also be a bit-flip candidate, and the syndrome vector is updated based on the chosen second subset of candidate locations. Additionally, for each candidate location of the second subset of candidate locations of the syndrome vector, the counter associated with the syndrome vector is incremented by one. This iterative process can continue until the maximum number of candidate solutions has been reached, or until a valid codeword is found. If none of the candidate solutions result in a valid codeword, the decoded codeword is rejected.

At block 1420, the ED system can estimate an error vector based on selecting one or more bit locations with confidence values from the set of confidence values above threshold value and applying hard decision decoding to the selected one or more bit locations. In some embodiments, the error vector corresponds to the one or more bit locations suspected to be erroneous when a confidence value of the set of confidence values at a bit location is above the threshold value, and wherein the sum LLR score is calculated based on executing a summation of a subset of LLRs of the one or more bit locations of the error vector suspected to be erroneous. In some embodiments, the error vector is a list of bit locations suspected to be erroneous when a confidence value at a particular bit location is above the threshold value. In some embodiments, the threshold value can be adjusted based on the signal-to-noise ratio of the channel, and it can be set to a higher value to reduce the number of erroneous bit locations in the error vector.

For example, assume he set of confidence values for a received codeword are:

{0.12, 0.78, 0.96, 0.05, 0.43, 0.89, 0.77, 0.60}

And the threshold value for selecting bit locations is set to 0.7. Based on the confidence values, the ED system can select bit locations 2, 3, 6, and 7 for possible errors, as their confidence values are above the threshold. The error vector would then be:

{0, 1, 1, 0, 0, 1, 1, 0} where the 1's correspond to the selected bit locations that are suspected to be erroneous, and the 0's correspond to the remaining bits that are not selected.

At block 1430, the ED system can calculate a sum LLR score for the estimated error vector. In some embodiments, once the error vector is obtained, the sum-LLR score can be calculated based on a summation of a subset of LLRs corresponding to the one or more bit locations in the error vector suspected to be erroneous. This score is used to rank the potential solutions for the received codeword, and the solution with the lowest sum-LLR score is selected as the most likely error pattern for the codeword. That is, for each solution in the set, the sum of the LLR values of the error locations in the solution is calculated. In some embodiments, the solution with the minimum sum of LLR is selected as the most likely error pattern for the received codeword. If, after all candidate error locations have been considered, the updated syndrome vector is still non-zero, the outputted decoded codeword is rejected, as it indicates that none of the candidate solutions resulted in a valid codeword.

In some embodiments, the sum LLR score is a measure of the reliability of the error pattern, and is used to rank potential solutions for the received codeword. For each candidate solution in the set, the sum of the LLR values of the error locations in the solution is calculated. As an example, if a candidate solution for a received codeword has error locations at bits 2, 5, and 9, then the sum-LLR score is the sum of the absolute values of the LLRs at those bit locations. The solution with the minimum sum-LLR score is selected as the most likely error pattern for the received codeword. If, after considering all candidate error locations, the updated syndrome vector is still non-zero, the outputted decoded codeword is rejected as none of the candidate solutions resulted in a valid codeword.

For example, assuming that the LLR values for each bit location are as follows:

$\{sLLR_1, sLLR_2, sLLR_3, sLLR_4, sLLR_5, sLLR_6, sLLR_7\} = \{2.3, -1.1, -3.5, 0.9, -2.7, -1.8, 1.5\}$

The subset of LLRs corresponding to the estimated error vector e is:

$\{sLLR_3, sLLR_5, sLLR_6\}$

Therefore, the sum-LLR score is calculated by taking the absolute value of each LLR and then summing them:

$|sLLR_3| + |sLLR_5| + |sLLR_6| = 3.5 + 2.7 + 1.8 = 8.0$

In this case, the sum-LLR score for the estimated error vector e is 8.0.

At block 1440, the ED system can output a decoded codeword based on the estimated error vector and the sum LLR score. After obtaining the estimated error vector and the sum-LLR score, the ED system can perform error correction by flipping the bits in the error vector to correct the errors in the received codeword. The corrected bits are then appended to the original codeword to produce the decoded codeword. The sum-LLR score is also used to evaluate the quality of the error correction process. In some embodiments, the sum-LLR score can be compared to a predefined threshold to determine whether the error correction process was successful. If the sum-LLR score is below the threshold, the error correction is considered successful, and the decoded codeword is outputted. Otherwise, the ED system may reject the outputted decoded codeword as it indicates that none of the candidate solutions resulted in a valid codeword.

In some embodiments, the decoded codeword is selected from a plurality of decoded codewords generated by a trained model based on selecting a minimum sum LLR score of a plurality of sum LLR score, and wherein the second subset of candidate locations comprises at least one candidate location of the first subset of candidate locations. That is, after updating the syndrome vector based on the first and second subsets of candidate locations, a plurality of decoded codewords are generated by the trained model using the updated syndrome vector and the corresponding error vectors obtained from each of the subsets. The sum LLR score is calculated for each of the decoded codewords, and the decoded codeword with the minimum sum LLR score is selected as the most likely solution for the received codeword. The second subset of candidate locations is chosen to include at least one candidate location from the first subset of candidate locations. This allows the iterative process to explore the space of potential solutions more thoroughly, increasing the likelihood of finding the correct solution.

In some embodiments, if the iterative soft DNN solver process does not result in a zero syndrome vector, the outputted decoded codeword is rejected. This is because a non-zero syndrome vector indicates that there are still errors in the codeword that have not been corrected by the decoder. To address this, the system can generate an updated syndrome vector by adding binary representations of the error vector to the current syndrome vector. The addition of these binary representations adjusts the syndrome vector to account for the location and values of the errors that were not corrected in the previous iteration. If the updated syndrome vector is still non-zero, the iterative soft DNN solver process can be repeated with a new error vector that includes the errors from the previous iteration, as well as any new errors that are identified. This process can be repeated until the syndrome vector is zero or until a maximum number of iterations is reached. In this way, the decoder is able to correct as many errors as possible within the limits of the DNN's capabilities, thereby improving the accuracy of the decoded codeword.

In some embodiments, the iterative soft DNN decoding process can further include, during a first iteration, the ED system can identify the first bit location from the error vector with the highest confidence value and update the first LLR at the first bit location accordingly. In some embodiments, the ED system can update the output vector to include the first LLR, and update the sum LLR score based on the first LLR score. The ED system can also update the syndrome vector corresponding to a bit-flip at the first bit location. If the syndrome vector is non-zero, the ED system can perform a second iteration by analyzing (or modeling) a second set of LLRs and the updated syndrome vector to obtain a second set of confidence values for each bit of the codeword. In some embodiments, during the second iteration, the ED system can identify the second bit location from the error vector with the second highest confidence value and update the second LLR at the second bit location accordingly. In some embodiments, the ED system can update the output vector to include the second LLR and update the sum LLR score based on the second LLR score. These steps can be repeated until the syndrome vector becomes zero or until a termination condition is met. The iterative process allows the ED system to gradually converge to a solution while performing only the most confident error fixes each iteration, thereby reducing the overall computational complexity.

Figure 15:
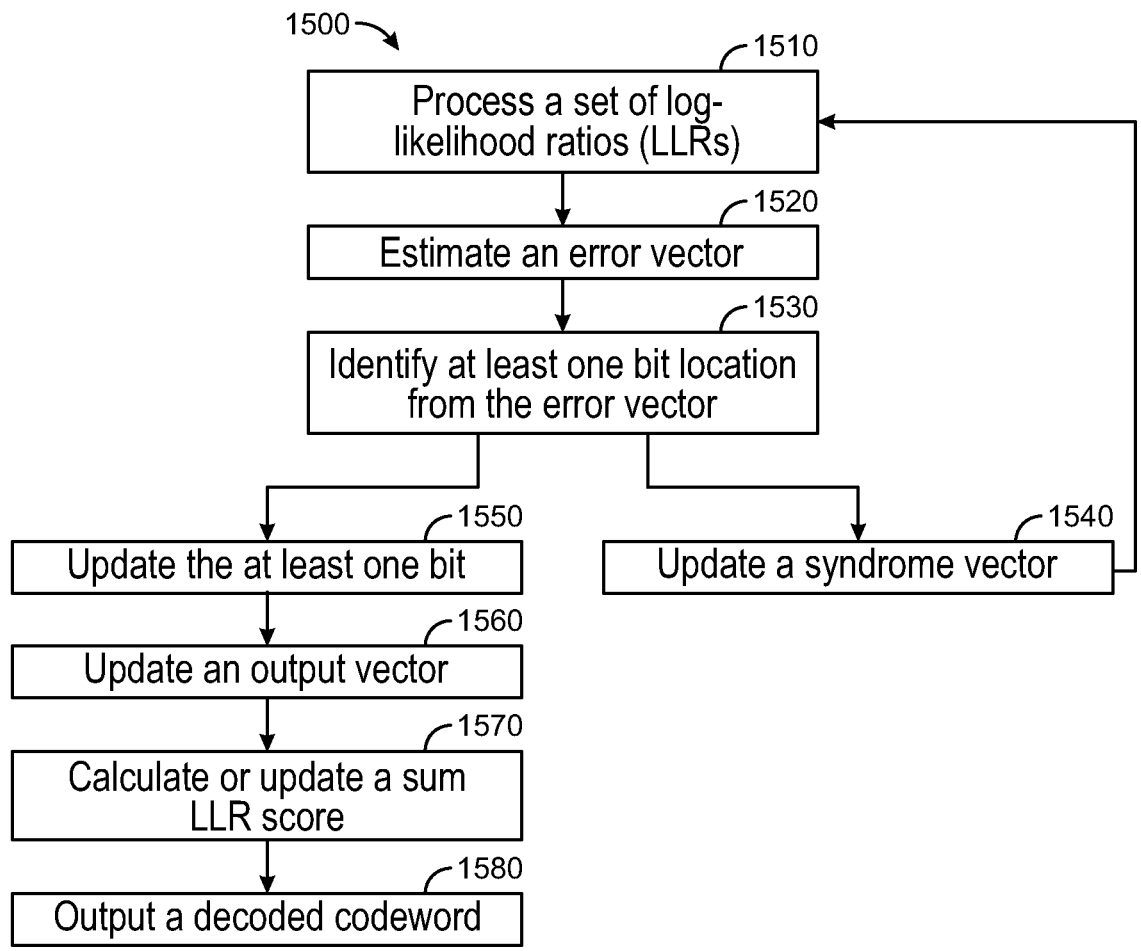
FIG. 15 is a flowchart for a method to perform operations associated with a storage medium, according to some arrangements.

FIG. 15 is a flowchart for a method to perform operations associated with a storage medium, according to some arrangements. An encoding/decoding (ED) system, such as controller 110 of non-volatile storage device 100 or controller 202, can be configured to perform method 1500. Further, any computing device described herein can be configured to perform method 1500.

In broad overview of method 1500, at block 1510, the ED system can process (or analyze) a set of log-likelihood ratios (LLRs). At block 1520, the ED system can estimate an error vector. At block 1530, the ED system can identify at least one bit location from the error vector. At block 1540, the ED system can update a syndrome vector. At block 1550, the ED system can update the at least one bit. At block 1560, the ED system can update an output vector. At block 1570, the ED system can calculate or update a sum LLR score. At block 1580, the ED system can output a decoded codeword. Additional, fewer, or different operations may be performed depending on the particular arrangement. In some embodiments, some or all operations of method 1500 may be performed by controller 110 or other systems described herein. In various embodiments, each operation may be re-ordered, added, removed, or repeated. In some arrangements, blocks can be optionally executed by the controller 202. In some embodiments, method 1500 is further described above with reference to FIGS. 7-8.

At block 1510, the ED system can process (analyze) or re-process (re-analyze), during a first iteration of a plurality of iterations, a set of log-likelihood ratios (LLRs) and a syndrome vector to obtain a set of confidence values for each bit of a codeword. Additional details regarding processing are described in detail with reference to block 1410 of FIG. 14.

At block 1520, the ED system can estimate, during the first iteration, an error vector based on selecting one or more bit locations with confidence values above threshold value and applying hard decision decoding to the selected one or more bit locations. Additional details regarding estimating are described in detail with reference to block 1420 of FIG. 14.

At block 1530, the ED system can identify, during the first iteration, a first bit location from the error vector with a first highest confidence value. This corresponds to the location where the error is most likely to occur, and will be the first location to be fixed during the iterative decoding process. The confidence value represents the level of certainty that the DNN has in the presence of an error at that particular bit location. The higher the confidence value, the more certain the DNN is that an error has occurred at that location, and the more likely it is that the error will be corrected by making the appropriate bit flip. By choosing the highest confidence value, the ED system can prioritize the most likely error locations and increase the efficiency of the decoding process. In some embodiments, the highest reliability error fix $e_1$ refers to the bit location in the error vector e that has the highest confidence value, as determined by the soft DNN solver.

At block 1540, the ED system can update, during the first iteration, the syndrome vector corresponding to a bit-flip at the first bit location. In some embodiments, the ED system can simulate the effect of a bit-flip at the identified bit location on the original syndrome vector, which is a vector that stores the parity check equations for the codeword. If the codeword is valid, the syndrome vector should be zero. However, introducing a bit-flip can cause the syndrome vector to become non-zero, indicating that an error has occurred. By updating the syndrome vector at this block, the ED system ensures that it reflects the most likely error value for the bit location identified at block 1530. The ED system updates the syndrome vector by assuming that there is a bit-flip at the location identified at block 1530, and then recomputing the syndrome vector based on the modified codeword. This allows the ED system to test whether flipping the bit at that location would result in a valid codeword, which can be used to determine the likelihood of an error at that location. If the updated syndrome vector is zero, it means that the bit-flip at the identified location resulted in a valid codeword, and so the ED system can proceed with the error correction process. If the updated syndrome vector is non-zero, it means that the bit-flip did not result in a valid codeword, and the ED system will need to try a different location or combination of locations to correct the error.

At block 1550, the ED system can update, during the first iteration, a bit of a first LLR at the first bit location. Once this location has been identified at block 1530, the ED system updates the corresponding bit of the LLR at that location at block 1550. That is, the LLR value for the bit at that location is modified in a way that reflects the most likely error value for that bit.

At block 1560, the ED system can update, during the first iteration, an output vector to include the first LLR. That is, the updated LLR value of block 1550 is then included in the output vector at block 1560. The output vector is a vector that stores the updated LLR values for all bits in the codeword. This updated LLR value is then used in the next iteration of the algorithm to determine the location of the next highest confidence error fix.

At block 1570, the ED system can update, during the first iteration, a sum LLR score based on a first LLR score of the first LLR. This score is used to rank the potential solutions for the received codeword, and the solution with the lowest sum-LLR score is selected as the most likely error pattern for the codeword. This allows the system to converge on a solution for the received codeword by iteratively identifying and fixing the most likely errors based on the confidence values provided by the soft DNN solver.

At block 1580, the ED system can output a decoded codeword based on the estimated error vector and the sum LLR score, responsive to completing the plurality of iterations. This occurs after completing the plurality of iterations, which can involve identifying and updating multiple bit locations in the error vector, updating the syndrome vector, and generating updated confidence values for each bit of the codeword. The decoded codeword output by the ED system is the most likely error pattern for the received codeword based on the iterative process, and can be used to correct errors in the received codeword.

Referring to method 1500 generally using an example with a single iteration. In this example, assume a codeword with 10 bits represented by a set of LLRs and a parity check matrix. During the first iteration, the ED system analyzes the set of LLRs and updates the syndrome vector to obtain a set of confidence values for each bit of the codeword. The estimated error vector is obtained by selecting bit locations with confidence values above a threshold value and applying hard decision decoding. In this example, assume ED system identifies the bit at location 7 as having the highest confidence value for error correction. The ED system updates the syndrome vector by assuming a bit-flip at location 7. Then, the LLR value of the bit at location 7 is updated based on this change. In this example, assume that the first LLR score for this bit after the update is −5. The sum LLR score is updated by adding the first LLR score to the previous sum LLR score. After completing the iterations, the decoded codeword is output based on the estimated error vector and the sum LLR score.

Referring to method 1500 generally using another example with multiple iterations. In this example, during the first iteration, assume the analyze generates a set of LLRs and a syndrome vector that provide confidence values for each bit of a codeword. The ED system then estimates an error vector by selecting one or more bit locations with confidence values above a threshold and applying hard decision decoding to those locations. Assume the estimated error vector is [0 0 1 0], corresponding to a single bit flip at the third location. The ED system then identifies the first bit location with the highest confidence value, which is the third location. The ED system updates the syndrome vector by assuming a bit flip at this location, and updates the LLR value at the third location to reflect the most likely error value for that bit. The sum LLR score is updated based on the first LLR score of the third location. During the second iteration, the analysis generates a new set of LLRs and an updated syndrome vector to obtain a new set of confidence values for each bit of the codeword. Assume the estimated error vector is [1 0 0 0], corresponding to a single bit flip at the first location. The ED system identifies the first bit location with the highest confidence value, which is now the first location. The ED system updates the syndrome vector and LLR value at the first location, and updates the sum LLR score based on the first LLR score of the first location. Finally, the ED system outputs a decoded codeword based on the estimated error vector and the sum LLR score, responsive to completing the two iterations.

Referring to FIGS. 5-10 and 14-15, the soft DNN BCH decoder can be used as a component decoder within a larger decoder, where the BCH code is just one of the multiple components. An iterative decoder can be used to improve the decoding performance. For example, a product code can be composed of multiple BCH components organized to provide two-dimensional encoding for input payload. Another example can be a half-folded product code, where every information bit is encoded by at least two code components, and each component is intersected with all other code components. To simplify hardware implementations, a simplified code structure can be obtained by defining groups of independent code components. In this way, every group of code components encodes separate sets of information bits. If every component is a BCH code, then soft iterative decoding with DNN soft decoding per component can be implemented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A memory system comprising:
   a storage medium; and
   an encoding/decoding (ED) system configured to perform operations associated with the storage medium, the ED system being configured to:
   process a set of log-likelihood ratios (LLRs) and a syndrome vector to obtain a set of confidence values for each bit of a codeword;
   estimate an error vector based on selecting one or more bit locations with confidence values from the set of confidence values above threshold value and applying hard decision decoding to the selected one or more bit locations;
   calculate a sum LLR score for the estimated error vector; and
   output a decoded codeword based on the estimated error vector and the sum LLR score.

2. The memory system of claim 1, the ED system is further configured to:
   obtain, by soft sampling based on issuing multiple page-reads on a channel, the set of LLRs representing codeword bits of the codeword, wherein the channel is an additive noise channel; and
   determine the syndrome vector for the codeword based on a parity check matrix and a hard decision vector of a channel output of the channel, wherein the ED system analyzes the set of LLRs based on the syndrome vector being above zero.

3. The memory system of claim 2, wherein the syndrome vector corresponds to a difference between an expected parity check value and an actual parity check value, and wherein each value per bit of the set of LLR values is a scaled version of the channel output of the channel, and wherein the decoded codeword comprises a sum of reliabilities of all error locations.

4. The memory system of claim 2, wherein the syndrome vector is further determined based on the hard decision vector being multiplied by the parity check matrix, wherein the hard decision vector comprises binary values for each bit of the codeword, and wherein the parity check matrix is an m by n (m×n) matrix where m is a number of check equations and n is a length of the codeword.

5. The memory system of claim 2, the ED system is further configured to:
generate an updated syndrome vector, responsive to adding binary representations of the error vector to the syndrome vector; and
in response to the updated syndrome vector being non-zero, reject the outputted decoded codeword.

6. The memory system of claim 1, wherein the error vector corresponds to the one or more bit locations suspected to be erroneous when a confidence value of the set of confidence values at a bit location is above the threshold value, and wherein the sum LLR score is calculated based on executing a summation of a subset of LLRs of the one or more bit locations of the error vector suspected to be erroneous.

7. The memory system of claim 1, wherein processing comprises using a trained model, wherein the trained model is a fully-connected (FC) deep neural network (DNN) comprising rectified linear unit (ReLU) activation nodes, and wherein the processing further comprises executing a softmax function to obtain the set of confidence values for each bit of the codeword.

8. The memory system of claim 1, the ED system is further configured to:
generate a plurality of candidate locations based on reliabilities of each bit of the codeword of a sorted set of LLRs of the set of the LLRs, wherein generating the plurality of candidate locations comprises independently analyzing each LLR of the sorted set of LLRs;
choose a first subset of candidate locations of the plurality of candidate locations within a first span of the sorted set of LLRs, wherein the chosen first subset of candidate locations corresponds to a plurality of first lowest LLRs of the sorted set of LLRs, and wherein each candidate location of the first subset of candidate locations is a bit-flip candidate;
update the syndrome vector based on the chosen first subset of candidate locations; and
wherein performing the operations associated with the storage medium comprises soft BCH decoding and wherein the codeword is BCH component code.

9. The memory system of claim 8, wherein the syndrome vector is associated with a candidate counter, and wherein for each candidate location of the first subset of candidate locations of the syndrome vector a counter is incremented by one.

10. The memory system of claim 9, the ED system is further configured to:
in response to the counter being below a maximum number of candidate solutions after the outputted codeword, choose a second subset of candidate locations of the plurality of candidate locations within a second span of the sorted set of LLRs, wherein the chosen first subset of candidate locations corresponds to a plurality of second lowest LLRs of the sorted set of LLRs; and
update the syndrome vector based on the chosen second subset of candidate locations, wherein for each candidate location of the second subset of candidate locations of the syndrome vector the counter is incremented by one.

11. The memory system of claim 10, wherein the decoded codeword is selected from a plurality of decoded codewords generated by a trained model based on selecting a minimum sum LLR score of a plurality of sum LLR score, and wherein the second subset of candidate locations comprises at least one candidate location of the first subset of candidate locations.

12. The memory system of claim 1, the ED system is further configured to:
identify, during a first iteration, a first bit location from the error vector with a first highest confidence value;
update, during the first iteration, a first bit of a first LLR at the first bit location;
update, during the first iteration, an output vector to include the first LLR; and
update, during the first iteration, the sum LLR score based on a first LLR score of the first LLR.

13. The memory system of claim 12, the ED system is further configured to:
update, during the first iteration, the syndrome vector corresponding to a bit-flip at the first bit location;
in response to the syndrome vector being non-zero, analyze, during a second iteration, a second set of log-likelihood ratios (LLRs) and the updated syndrome vector to obtain a second set of confidence values for each bit of the codeword;
identify, during the second iteration, a second bit location from the error vector with a second highest confidence value;
update, during the second iteration, a second bit of a second LLR at the second bit location;
update, during the second iteration, the output vector to include the second LLR; and
update, during the second iteration, the sum LLR score based on a second LLR score of the second LLR.

14. A memory system comprising:
a storage medium; and
an encoder/decoder (ED) system configured to perform operations associated with the storage medium, the ED system being configured to:
process, during a first iteration of a plurality of iterations, a set of log-likelihood ratios (LLRs) and a syndrome vector to obtain a set of confidence values for each bit of a codeword;
estimate, during the first iteration, an error vector based on selecting one or more bit locations with confidence values above threshold value and applying hard decision decoding to the selected one or more bit locations;
identify, during the first iteration, a first bit location from the error vector with a first highest confidence value;
update, during the first iteration, the syndrome vector corresponding to a bit-flip at the first bit location;
update, during the first iteration, a bit of a first LLR at the first bit location;
update, during the first iteration, a sum LLR score based on a first LLR score of the first LLR; and
output a decoded codeword based on the estimated error vector and the sum LLR score, responsive to completing the plurality of iterations.

15. The memory system of claim 14, the ED system is further configured to:
obtain, by soft sampling based on issuing multiple page-reads on a channel, the set of LLRs representing codeword bits of the codeword, wherein the channel is an additive noise channel; and
determine the syndrome vector for the received codeword based on a parity check matrix and a hard decision vector of a channel output of the channel, wherein the ED system analyzes the set of LLRs based on the syndrome vector being above zero, wherein the syndrome vector is further determined based on the hard decision vector being multiplied by the parity check matrix.

16. The memory system of claim 15, wherein the syndrome vector corresponds to a difference between an expected parity check value and an actual parity check value, and wherein each value per bit of the set of LLR values is a scaled version of the channel output of the channel, and wherein the decoded codeword comprises a sum of reliabilities of all error locations, and wherein the hard decision vector comprises binary values for each bit of the codeword, and wherein the parity check matrix is an m by n (m×n) matrix where m is a number of check equations and n is a length of the codeword.

17. A computer-implemented method comprising:
processing a set of log-likelihood ratios (LLRs) and a syndrome vector to obtain a set of confidence values for each bit of a codeword;
estimating an error vector based on selecting one or more bit locations with confidence values from the set of confidence values above threshold value and applying hard decision decoding to the selected one or more bit locations;
calculating a sum LLR score for the estimated error vector; and
outputting a decoded codeword based on the estimated error vector and the sum LLR score.

18. The computer-implemented method of claim 17, further comprising:
obtaining, by soft sampling based on issuing multiple page-reads on a channel, the set of LLRs representing codeword bits of the codeword, wherein the channel is an additive noise channel;
determining the syndrome vector for the received codeword based on a parity check matrix and a hard decision vector of a channel output of the channel, wherein the ED system analyzes the set of LLRs based on the syndrome vector being above zero, wherein the syndrome vector is further determined based on the hard decision vector being multiplied by the parity check matrix;
generating an updated syndrome vector, responsive to adding binary representations of the error vector to the syndrome vector; and
in response to the updated syndrome vector being non-zero, rejecting the outputted decoded codeword.

19. The computer-implemented method of claim 18, wherein the syndrome vector corresponds to a difference between an expected parity check value and an actual parity check value, and wherein each value per bit of the set of LLR values is a scaled version of the channel output of the channel, and wherein the decoded codeword comprises a sum of reliabilities of all error locations, and wherein the hard decision vector comprises binary values for each bit of the codeword, and wherein the parity check matrix is an m by n (m×n) matrix where m is a number of check equations and n is a length of the codeword.

20. The computer-implemented method of claim 17, further comprising:
generating a plurality of candidate locations based on reliabilities of each bit of the codeword of a sorted set of LLRs of the set of the LLRs, wherein generating the plurality of candidate locations comprises independently analyzing each LLR of the sorted set of LLRs;
choosing a first subset of candidate locations of the plurality of candidate locations within a first span of the sorted set of LLRs, wherein the chosen first subset of candidate locations corresponds to a plurality of first lowest LLRs of the sorted set of LLRs, and wherein each candidate location of the first subset of candidate locations is a bit-flip candidate; and
updating the syndrome vector based on the chosen first subset of candidate locations, and wherein the syndrome vector is associated with a candidate counter, and wherein for each candidate location of the first subset of candidate locations of the syndrome vector a counter is incremented by one.

* * * * *